US012797920B2

(12) United States Patent
Kanda et al.

(10) Patent No.: US 12,797,920 B2
(45) Date of Patent: Nov. 17, 2026

(54) WASHING DEVICE, AND METHOD OF MANUFACTURING SEMICONDUCTOR DEVICE

(71) Applicant: Kioxia Corporation, Tokyo (JP)

(72) Inventors: Naoki Kanda, Yokkaichi Mie (JP); Hiroshi Tomita, Yokkaichi Mie (JP); Tooru Mikami, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/175,706

(22) Filed: Feb. 28, 2023

(65) Prior Publication Data

US 2023/0330720 A1 Oct. 19, 2023

(30) Foreign Application Priority Data

Apr. 14, 2022 (JP) ................................ 2022-067029

(51) Int. Cl.

| | |
|---|---|
| ***B08B 9/093*** | (2006.01) |
| ***B08B 13/00*** | (2006.01) |
| ***G05D 23/19*** | (2006.01) |
| ***H10P 72/30*** | (2026.01) |

(52) U.S. Cl.

CPC .............. *B08B 9/093* (2013.01); *B08B 13/00* (2013.01); *G05D 23/1919* (2013.01); *B08B 2209/08* (2013.01); *H10P 72/3411* (2026.01)

(58) Field of Classification Search

CPC ........... B08B 2230/01; H01L 21/67778; H10P 72/3411

See application file for complete search history.

(56) References Cited

U.S. PATENT DOCUMENTS

| | | | |
|---|---|---|---|
| 2004/0216766 A1 | 11/2004 | Wen et al. | |
| 2010/0319730 A1 | 12/2010 | Rebstock | |
| 2014/0069467 A1 | 3/2014 | Rebstock | |
| 2014/0158172 A1 | 6/2014 | Hsu et al. | |
| 2019/0247900 A1 | 8/2019 | Park et al. | |

FOREIGN PATENT DOCUMENTS

| | | | |
|---|---|---|---|
| CN | 103846262 A | 6/2014 | |
| CN | 110125065 A | 8/2019 | |
| CN | 111842380 A | 10/2020 | |
| DE | 4443757 A1 * | 6/1996 | ............. B01L 99/00 |

(Continued)

OTHER PUBLICATIONS

Machine translation: DE4443757; Noack, D. (Year: 1996).*

(Continued)

*Primary Examiner* — Natasha N Campbell
(74) *Attorney, Agent, or Firm* — Foley & Lardner LLP

(57) ABSTRACT

A washing device includes a temperature adjuster that is configured to at least one of: heat a first fluid for washing a container for storing a substrate; or cool a second fluid for washing the container, so as to supply the first fluid having a first temperature and the second fluid having a second temperature lower than the first temperature; and a washer that is configured to: supply the first fluid to a first surface of the container to heat and wash the container; and supply the second fluid to a second surface of the container to cool and wash the container.

16 Claims, 16 Drawing Sheets

(56) References Cited

FOREIGN PATENT DOCUMENTS

| | | | |
|---|---|---|---|
| JP | 2005-109523 | A | 4/2005 |
| JP | 2010-109523 | A | 5/2010 |
| JP | 2019-004009 | A | 1/2019 |
| TW | I750453 | B | 12/2021 |

OTHER PUBLICATIONS

S. Case, et al., "Impact of FOUP Environment on Product Yield in Advanced Technologies" 2016 27th Annual Semi Advanced Semiconductor Manufacturing Conference (ASMC), Saratoga Springs, NY, USA, May 16-19, 2016, DOI: 10.1109/ASMC.2016.7491118.
S. Pauly, "Permeability and Diffusion Data" Polymer handbook 4th Edition, John Wiley & Sons, Inc., 1999 pp. 543-569.

* cited by examiner

WASHING DEVICE, AND METHOD OF MANUFACTURING SEMICONDUCTOR DEVICE

CROSS-REFERENCE TO RELATED APPLICATION(S)

This application is based upon and claims the benefit of priority from Japanese Patent Application No. 2022-067029, filed Apr. 14, 2022, the entire contents of which are incorporated herein by reference.

FIELD

Embodiments described herein relate generally to a washing device and a method of manufacturing a semiconductor device.

BACKGROUND

When gas impregnates the polymer that forms a front opening unified pod (FOUP), it is typically challenging to remove the gas even by washing with water. This gas can be removed, for example, by vacuum-heating the FOUP. However, when the FOUP is vacuum-heated, there may be a defect in the FOUP such as deformation of the FOUP due to the heat.

DETAILED DESCRIPTION

Figure 1:
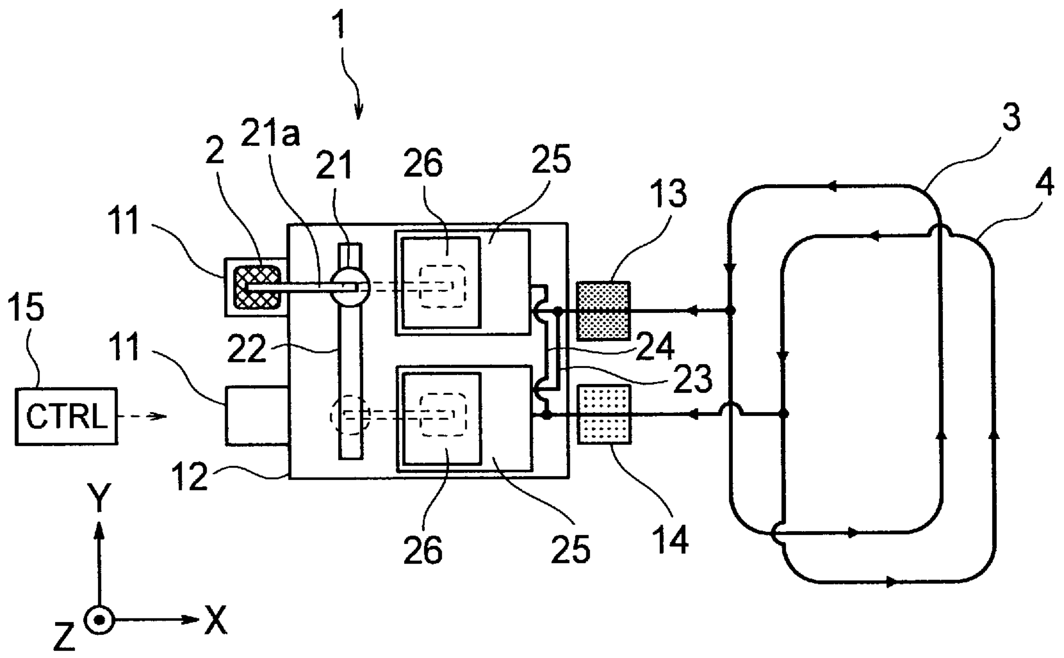
FIG. 1 is a plan view illustrating a configuration of a washing device according to the first embodiment.

Embodiments provide a washing device that can suitably wash a container for substrate storage and a method of manufacturing a semiconductor device.

In general, according to one embodiment, a washing device includes a temperature adjuster that is configured to at least one of: heat a first fluid for washing a container for storing a substrate; or cool a second fluid for washing the container, so as to supply the first fluid having a first temperature and the second fluid having a second temperature lower than the first temperature; and a washer that is configured to: supply the first fluid to a first surface of the container to heat and wash the container; and supply the second fluid to a second surface of the container to cool and wash the container.

Hereinafter, embodiments according to the present disclosure are described with reference to the drawings. In FIGS. 1 to 26C, the same configurations are denoted by the same reference numerals and overlapping descriptions are omitted.

First Embodiment

FIG. 1 is a plan view illustrating a configuration of a washing device 1 according to a first embodiment.

In FIG. 1, the washing device 1 is provided in a semiconductor manufacturing system. FIG. 1 indicates the washing device 1, a FOUP 2 placed on the washing device 1, a hot water channel 3 in the semiconductor manufacturing system, and a cold water channel 4 in the semiconductor manufacturing system. Each substrate processed in the semiconductor manufacturing system is stored in the FOUP 2 and is conveyed by conveying the FOUP 2. Each substrate stored in the FOUP 2 is, for example, a wafer. The FOUP 2 is an example of a container to store the substrate therein.

The washing device 1 is provided for washing the FOUP 2. When a substrate is processed by using a gas in the semiconductor manufacturing system and then the substrate is stored in the FOUP 2, the gas remaining on the substrate may be released from the substrate and adsorbed in the FOUP 2. When the gas is a corrosive gas, there is concern that the FOUP 2, a stored article in the FOUP 2, or various semiconductor manufacturing devices in the semiconductor manufacturing system may be adversely affected by the gas. Examples of such corrosive gases are halogen gas (for example, a fluorine gas and a chlorine gas) used in dry etching. Another example of such corrosive gases is an ammonia gas used in chemical vapor deposition.

Here, the washing device 1 removes the gas adsorbed in the FOUP 2 by washing the FOUP 2 with water. For example, a halogen gas and an ammonia gas adsorbed in the FOUP 2 are removed by dissolving in this water. At this time, dust and metal particles in the FOUP 2 are also removed by washing the FOUP 2. The washing device 1 can wash the FOUP 2 with hot water supplied from the hot water channel 3 or cold water supplied from the cold water channel 4. The water for washing the FOUP 2 is an example of a fluid washing a container.

The FOUP 2 is formed, for example, with a polymer. In this case, there is concern that the gas may be impregnated into the polymer that forms the FOUP 2. The gas impregnated into the polymer is hardly removed even if being washed with water and is also bled out from the polymer over time. As a result, the FOUP 2 is contaminated by the gas bled out.

The gas impregnated into the polymer can be removed, for example, by performing vacuum heating of the FOUP 2. Specifically, the gas impregnated into the polymer is expelled from the polymer by vacuum heating the FOUP 2. However, if the FOUP 2 is vacuum heated, there is concern that a defect such as deformation of the FOUP 2 due to heat may occur in the FOUP 2.

Therefore, the washing device 1 according to the present embodiment has a configuration as described below. Accordingly, the FOUP 2 can be suitably washed, and thus the gas impregnated into the polymer can be removed by washing the FOUP 2 with water.

The washing device 1 according to the present embodiment includes a plurality of load ports 11, a chamber 12, a heating unit 13, a cooling unit 14, and a control unit (or controller) 15. The chamber 12 includes a conveyance robot 21, a conveyance rail 22, a hot water channel 23, a cold water channel 24, a plurality of washing units (or washers) 25, and a plurality of drying units (or dryers) 26. The conveyance robot 21 includes a conveyance arm 21*a*. The heating unit 13, the cooling unit 14, the hot water channel 23, and the cold water channel 24 are examples of a temperature adjusting unit (or temperature adjuster).

FIG. 1 illustrates an X direction, a Y direction, and a Z direction that are perpendicular to each other. In this specification, the +Z direction is treated as an upward direction, and the −Z direction is treated as a downward direction. The −Z direction may or may not be identical to the direction of gravity.

Figure 2:
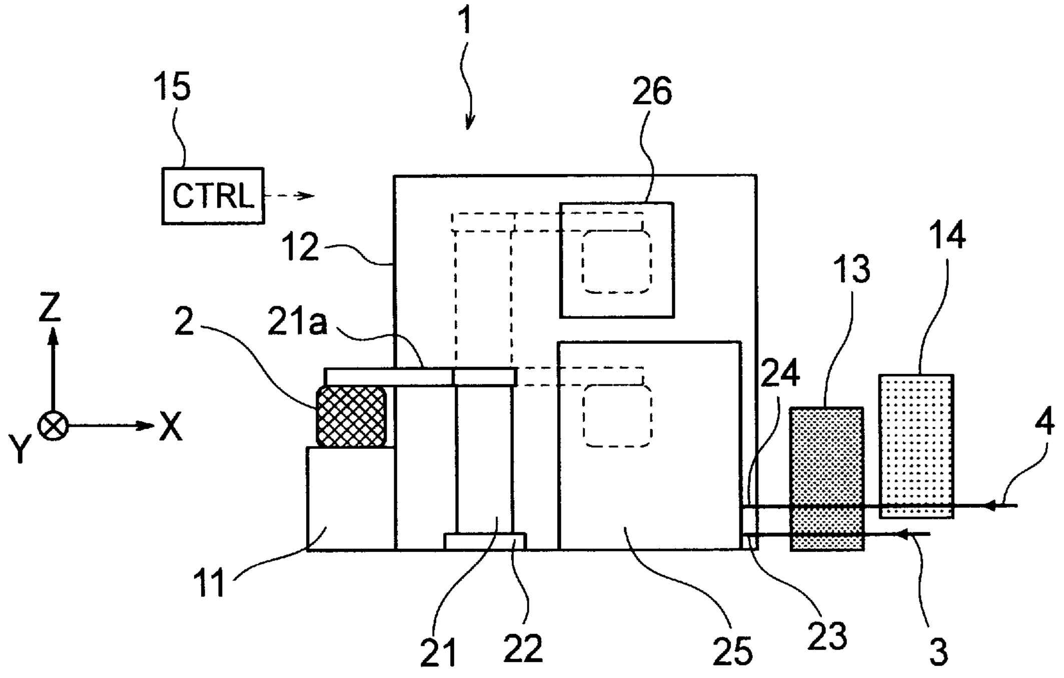
FIG. 2 is a cross-sectional view illustrating a configuration of the washing device according to the first embodiment.

Hereinafter, the configuration of the washing device 1 according to the present embodiment is described with reference to FIG. 1. In this description, FIG. 2 is referred to, as appropriate. FIG. 2 is a cross-sectional view illustrating a configuration of the washing device 1 according to the first embodiment.

[Load Ports 11 and Chamber 12]

Each load port 11 is a location where the FOUP 2 is placed. When the FOUP 2 is washed, the FOUP 2 is placed on any one of the load ports 11, taken into the chamber 12, and washed in the chamber 12. Meanwhile, the FOUP 2 washed in the chamber 12 is taken out from the chamber 12, placed on any one of the load ports 11, and used again in the semiconductor manufacturing system. Before the FOUP 2 is washed, the substrate in the FOUP 2 is taken out of the FOUP 2.

In addition, the number of the load ports 11 of the washing device 1 is two in FIG. 1 but may be other than two.

[Conveyance Robot 21 and Conveyance Rail 22]

The conveyance robot 21 is a robot for conveying the FOUP 2. As illustrated in FIGS. 1 and 2, the conveyance robot 21 can convey the FOUP 2 between the load ports 11, the washing units 25, and the drying units 26. At this time, the conveyance robot 21 can move on the conveyance rail 22, if necessary. The conveyance robot 21 can convey the FOUP 2 by holding the FOUP 2 by the conveyance arm 21*a*.

[Heating Unit 13 and Hot Water Channel 23]

The heating unit 13 attracts water (hot water) from the hot water channel 3 and heats the attracted water. The water heated by the heating unit 13 is supplied to each washing unit 25 via the hot water channel 23 and used as washing water for washing the FOUP 2.

The hot water channel 3 (hot water line) is a channel for circulating hot water used for various applications in the semiconductor manufacturing system. The hot water channel 3 is formed, for example, by a pipe. The hot water flowing through the hot water channel 3 is, for example, pure water, and is used for washing a substrate or the like. The temperature of the hot water flowing through the hot water channel 3 is set to 60° C. to 70° C., because when the temperature is too high, the cost excessively increases.

The heating unit 13 heats, for example, water (hot water) attracted from the hot water channel 3 to 70° C. or higher and supplies the water to each washing unit 25. Therefore, the water having a temperature higher than the water flowing through the hot water channel 3 can be supplied to each washing unit 25, and thus washing efficiency of the FOUP 2 can be improved. Since the heating unit 13 generates water of 70° C. or higher from water of 60° C. to 70° C., heating efficiency for generating washing water having a higher temperature compared with a case where water of 70° C. or higher is generated from water in room temperature can be increased. The hot water flowing through the hot water channel 3 is pure water, and thus it is possible to generate washing water with clean water having less particles. The heating unit 13 attracts a required amount of hot water flowing through the hot water channel 3 and generates washing water to be supplied to each washing unit 25. The temperature of 70° C. or higher is an example of a first temperature. The water attracted from the hot water channel 3 is an example of a first fluid.

In addition, in FIGS. 1 and 2, the heating unit 13 is located to be far from the chamber 12 but may be located in contact with the chamber 12 and may be located in the chamber 12, not out of the chamber 12. In addition, the heating unit 13 may be located above, below, or on the side of the chamber 12. It is noted that, for preventing the decrease in the temperature of water between the heating unit 13 and each washing unit 25, the heating unit 13 preferably is located close to each washing unit 25.

The hot water channel 23 is a channel for supplying water heated by the heating unit 13 to each washing unit 25. The hot water channel 23 may be a part of the hot water channel 3 or may be a channel different from the hot water channel 3. The entire or a part of the hot water channel 23 is located in the chamber 12.

[Cooling Unit 14 and Cold Water Channel 24]

The cooling unit 14 attracts water (cold water) from the cold water channel 4 and cools the attracted water. The water cooled by the cooling unit 14 is supplied to each washing unit 25 via the cold water channel 24 and is used as washing water for washing the FOUP 2.

The cold water channel 4 (cold water line) is a channel for circulating cold water used for various applications in the semiconductor manufacturing system. The cold water channel 4 is formed, for example, by a pipe. The cold water flowing through the cold water channel 4 is, for example, pure water and is used for washing a substrate or the like. The temperature of the cold water flowing through the cold water channel 4 may be any one of room temperature, a temperature higher than room temperature, and a temperature lower than room temperature. Since the cost excessively increases if the temperature is too low, the temperature of the cold water flowing through the cold water channel 4 is set, for example, to 10° C. to 20° C.

The cooling unit 14 cools the water (cold water) attracted, for example, from the cold water channel 4 to 10° C. or lower and supplies the water to each washing unit 25. Therefore, water having a temperature lower than water flowing through the cold water channel 4 can be applied to each washing unit 25, and thus the FOUP 2 can be efficiently cooled. Since the cold water flowing through the cold water channel 4 is pure water, washing water can be generated with clean water having less particles. The cooling unit 14 attracts a necessary amount of the cold water flowing through the cold water channel 4 to generate washing water to be supplied to each washing unit 25. The temperature of 10° C. or lower is an example of a second temperature. The water that is attracted from the cold water channel 4 is an example of a second fluid.

In addition, in FIGS. 1 and 2, the cooling unit 14 is located far from the chamber 12 but may be located in contact with the chamber 12 or may be located in the chamber 12, not out of the chamber 12. In addition, the cooling unit 14 may be located above, below, or on the side of the chamber 12. It is noted that, for preventing the increase in the temperature of water between the cooling unit 14 and each washing unit 25, the cooling unit 14 is preferably located close to each washing unit 25.

The cold water channel 24 is a channel for supplying water cooled by the cooling unit 14 to each washing unit 25. The cold water channel 24 may be a part of the cold water channel 4 and may be a channel different from the cold water channel 4. The entire or a part of the cold water channel 24 is located in the chamber 12.

In addition, the washing device 1 according to the present embodiment includes both the heating unit 13 and the cooling unit 14 but may include either the heating unit 13 or the cooling unit 14. For example, as long as the temperature difference of the inner surface and the outer surface of the FOUP 2 can be brought to 70° C. or higher, the washing device 1 according to the present embodiment may include either the heating unit 13 or the cooling unit 14. In addition, when cold water of 10° C. or lower flows through the cold water channel 4, the cold water channel 24 may supply the cold water to the washing unit 25 without change, and thus the cooling unit 14 can be omitted. In this case, the heating unit 13, the hot water channel 23, and the cold water channel 24 function as a temperature adjusting unit. In addition, when hot water of 70° C. or higher flows through the hot water channel 3, the hot water channel 23 may supply the hot water to the washing unit 25 without change, and thus the heating unit 13 can be omitted. In this case, the cooling unit 14, the hot water channel 23, and the cold water channel 24 function as a temperature adjusting unit. In addition, when the temperature in the polymer that forms the FOUP 2 can be brought to 70° C. or lower, by alternately supplying hot water and cold water to the FOUP 2, the washing device 1 according to the present embodiment may also include either the heating unit 13 or the cooling unit 14 as the temperature adjusting unit. In this case, a mechanism that can supply the cold water and the hot water with a temperature difference to the washing unit 25 functions as the temperature adjusting unit.

[Washing Unit 25]

Each washing unit 25 washes the FOUP 2 with the washing water. For example, each washing unit 25 can wash the FOUP 2 while heating, by supplying the water heated by the heating unit 13 to the FOUP 2. Therefore, the gas impregnated into the polymer that forms the FOUP 2 can be expelled from the polymer. In addition, each washing unit 25 can wash the FOUP 2 while the cooling, by supplying the water cooled by the cooling unit 14 to the FOUP 2. Therefore, the FOUP 2 heated with the water from the heating unit 13 can be cooled with the water from the cooling unit 14. Further details of each washing unit 25 are described below.

In addition, the number of the washing units 25 in the washing device 1 is two in FIG. 1 but may be other than two. In addition, the washing unit 25 washes the FOUP 2 with the water supplied from the heating unit 13 or the cooling unit 14 but may wash the FOUP 2 with other fluids (for example, a liquid) supplied from the heating unit 13 or the cooling unit 14.

[Drying Unit 26]

Each drying unit 26 dries the FOUP 2 washed by the washing unit 25. The FOUP 2 according to the present embodiment is taken into the chamber 12, washed by any one of the washing units 25, then dried by any one of the drying units 26, and taken out of the chamber 12.

In addition, in the washing device 1, the number of the drying units 26 is two in FIG. 1 but may be other than two. In addition, the drying unit 26 may be located over the washing unit 25 in FIG. 2 but may be located on the side or below the washing unit 25.

[Control Unit 15]

The control unit 15 controls various operations of the washing device 1. The control unit 15 controls, for example, a heating operation of the heating unit 13, a cooling operation of the cooling unit 14, a conveyance operation of the conveyance robot 21, a washing operation of each washing unit 25, and a drying operation of each drying unit 26. The control unit 15 controls timings for heating and cooling the FOUP 2 by each washing unit 25 and specifically adjusts a relationship between a heating timing and a cooling timing. Further details of the control unit 15 are described below.

Here, the heating and cooling of the FOUP 2 by each washing unit 25 are described.

The gas impregnated into the polymer that forms the FOUP 2 can be removed by heating the FOUP 2. Therefore, each washing unit 25 according to the present embodiment heats and washes the FOUP 2 with water of 70° C. or higher that is supplied from the heating unit 13. Accordingly, gas impregnated into the polymer is expelled from polymer and the gas expelled from the polymer can be washed with the washing water.

However, when the FOUP 2 is heated with the water from the heating unit 13, similarly to a case where the FOUP 2 is vacuum heated, there is concern that a defect such as deformation of the FOUP 2 due to heat may occur in the FOUP 2. The FOUP 2 according to the present embodiment is deformed, for example, if the temperature is 70° C. or higher. If water having a high temperature of 70° C. or higher is used, the gas impregnated into the polymer can be efficiently removed, but there is a problem that the FOUP 2 is deformed.

Therefore, when the FOUP 2 is heated and washed with water of 70° C. or higher, which is supplied from the heating unit 13, each washing unit 25 according to the present embodiment cools and washes the FOUP 2 with water of 10° C. or lower that is supplied from the cooling unit 14. Accordingly, the deformation of the FOUP 2 is prevented, and the gas impregnated into the polymer can be efficiently removed.

In addition, the temperature of the water from the heating unit 13 may be lower than 70° C., and the temperature of the water from the cooling unit 14 may be higher than 10° C. Also, the water supplied from the heating unit 13 is liquid-like water (liquid water) according to the present embodiment but may be vapor-like water (water vapor), instead. In this case, the heating unit 13 generates vapor-like water by heating liquid-like water (hot water) attracted from the hot water channel 3, and each washing unit 25 heats and washes the FOUP 2 by supplying the vapor-like water supplied from the heating unit 13 to the FOUP 2. That is, the heating unit 13 in this case generates the water vapor by evaporating hot water. Meanwhile, the cooling unit 14 may supply liquid other than water instead of water or together with water, to each washing unit 25 and may supply the gas instead of water or together with water to each washing unit 25. An example of a liquid is liquid nitrogen, and an example of the gas is nitrogen gas derived from liquid nitrogen. In this case, each washing unit 25 cools the FOUP 2 by supplying the gas supplied from the cooling unit 14 to the FOUP 2. Further details of these examples are described below.

Figure 3:
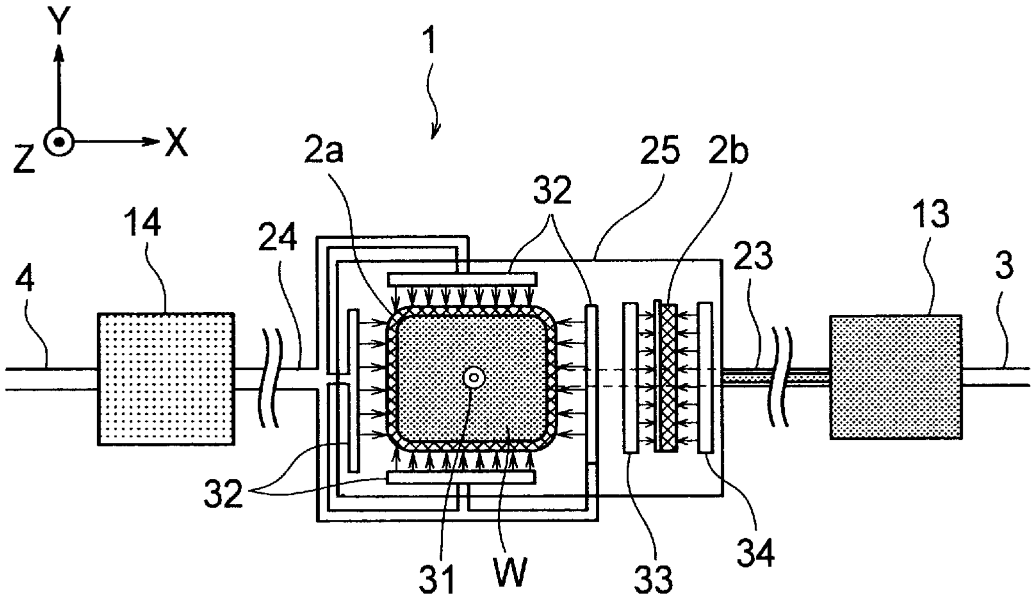
FIG. 3 is a plan view illustrating a first example of a configuration of the washing device according to the first embodiment.
Figure 4:
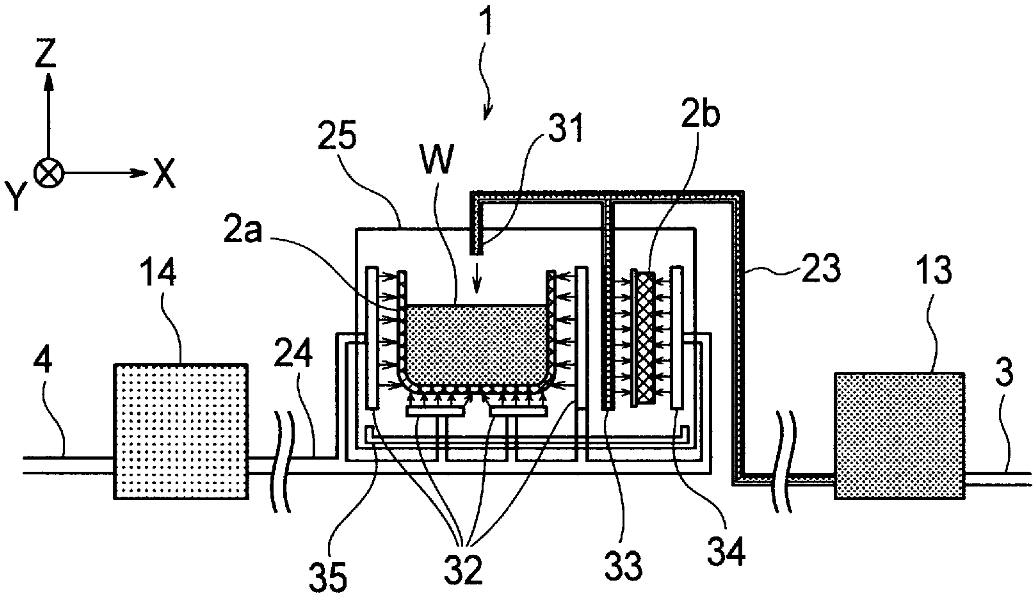
FIG. 4 is a cross-sectional view illustrating the first example of the configuration of the washing device according to the first embodiment.

FIGS. 3 and 4 are a plan view and a cross-sectional view respectively illustrating a first example of the configuration of the washing device 1 according to the first embodiment, respectively.

FIGS. 3 and 4 illustrate any one of the washing units 25 illustrated in FIG. 1 and configurations relating to the washing unit 25. The washing unit 25 includes a hot water nozzle 31, a cold water nozzle 32, a hot water nozzle 33, a cold water nozzle 34, and a drain pan 35. The hot water nozzle 31 and the cold water nozzle 32 are an example of a first washing unit. The hot water nozzle 33 and the cold water nozzle 34 are an example of a second washing unit.

The FOUP 2 according to the present embodiment is configured with a FOUP main body 2*a* that is a main body of the FOUP 2 and a FOUP door 2*b* that is a door (lid) of the FOUP 2. The FOUP main body 2*a* is an example of a first part. The FOUP door 2*b* is an example of a second part.

The hot water nozzle 31 heats and washes the FOUP main body 2*a* by dispensing water supplied from the heating unit 13 to the FOUP main body 2*a*. The cold water nozzle 32 cools and washes the FOUP main body 2*a* by dispensing the water supplied from the cooling unit 14 to the FOUP main body 2*a*. According to the present embodiment, the hot water nozzle 31 dispenses water to the inner surface of the FOUP main body 2*a*, and the cold water nozzle 32 dispenses water to the outer surface of the FOUP main body 2*a*. Accordingly, the FOUP main body 2*a* is heated from the inner surface side and cooled from the outer surface side. The inner surface of the FOUP main body 2*a* is an example of a first surface, and the outer surface of the FOUP main body 2*a* is an example of a second surface. Assuming that the substrate is contained inside the FOUP main body 2*a*, while the inner surface of the FOUP main body 2*a* is exposed with gas from the substrate, the outer surface of the FOUP main body 2*a* is not exposed with the gas. In view of this, in this embodiment, while the inner surface of the FOUP main body 2*a* as the first surface is heated, the outer surface of the FOUP main body 2*a* as the second surface is cooled.

The hot water nozzle 33 heats and washes the FOUP door 2*b* by dispensing the water supplied from the heating unit 13 to the FOUP door 2*b*. The cold water nozzle 34 cools and washes the FOUP door 2*b* by dispensing the water supplied from the cooling unit 14 to the FOUP door 2*b*. According to the present embodiment, the hot water nozzle 33 dispenses the water to the rear surface of the FOUP door 2*b*, and the cold water nozzle 34 dispenses the water to the front surface of the FOUP door 2*b*. Accordingly, the FOUP door 2*b* is heated from the rear surface side and is cooled from the front surface side. The rear surface of the FOUP door 2*b* is an example of the first surface. The front surface of the FOUP door 2*b* is an example of the second surface. The rear surface of the FOUP door 2*b* corresponds to the inner surface of the FOUP door 2*b*, and the front surface of the FOUP door 2*b* corresponds to the outer surface of the FOUP door 2*b*.

In FIGS. 3 and 4, the water dispensed from the hot water nozzle 31, the cold water nozzle 32, the hot water nozzle 33, and the cold water nozzle 34 is denoted by a reference numeral W. The water dispensed from the hot water nozzle 31, the cold water nozzle 32, the hot water nozzle 33, and the cold water nozzle 34 drops into the drain pan 35 and is accumulated in the drain pan 35. Thereafter, the water accumulated in the drain pan 35 is discharged out of the washing device 1.

When the FOUP 2 is washed, in the washing unit 25, the FOUP door 2*b* is detached from the FOUP main body 2*a*. The FOUP main body 2*a* is moved to a place near the hot water nozzle 31 and the cold water nozzle 32, and the FOUP door 2*b* is moved to a place near the hot water nozzle 33 and the cold water nozzle 34. In this manner, the FOUP main body 2*a* and the FOUP door 2*b* are washed at different locations in the washing unit 25.

The FOUP main body 2*a* is placed near the hot water nozzle 31 and the cold water nozzle 32 so that the bottom portion of the FOUP main body 2*a* faces downward and the opening of the FOUP main body 2*a* faces upward. In this state, the water heated by the heating unit 13 is poured from the hot water nozzle 31 into the FOUP main body 2*a*. Thereafter, the FOUP main body 2*a* is left in this state for a certain period of time in order to dissolve the gas existing on the inner surface of the FOUP main body 2*a*. As a result, not only the gas adsorbed in the inner surface of the FOUP main body 2*a* but also the gas impregnated into the polymer that forms the FOUP main body 2*a* can be removed from the FOUP main body 2*a*. The gas impregnated into the polymer is removed from the FOUP main body 2*a* by being diffused to the inner surface of the FOUP main body 2*a* to be dissolved in the water. Thereafter, the water accumulated in the FOUP main body 2*a* is discarded by changing the direction of the FOUP main body 2*a*.

In addition, the water accumulated in the FOUP main body 2*a* may be discarded by turning over the FOUP main body 2*a* and may be discarded by inserting a nozzle into the FOUP main body 2*a* and sucking out the hot water from the FOUP main body 2*a*. In addition, after the hot water is discarded from the FOUP main body 2*a*, the FOUP main body 2*a* may be washed for removing attached dusts.

Figure 5:
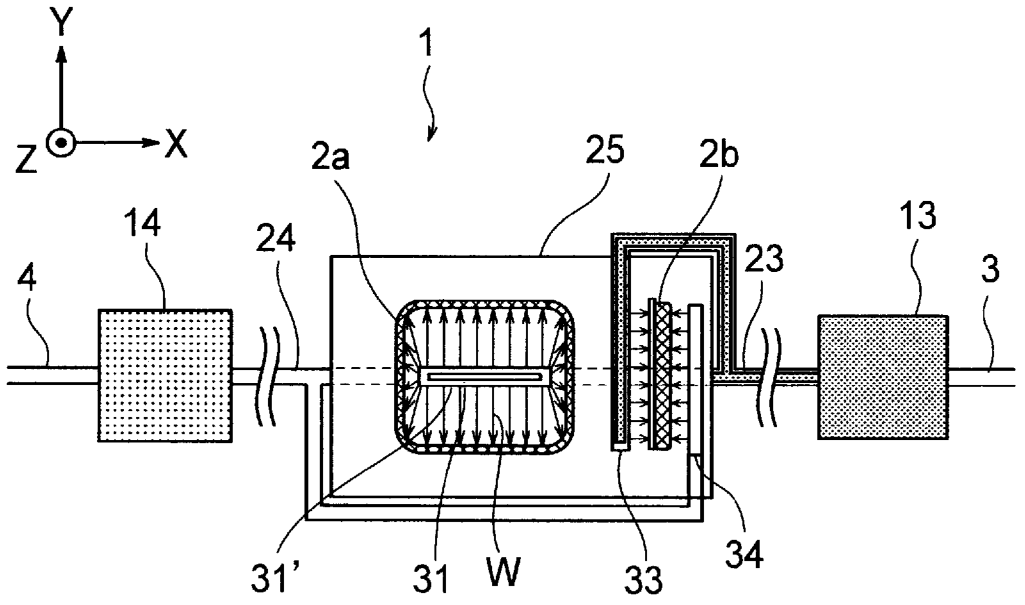
FIG. 5 is a plan view illustrating a second example of a configuration of the washing device according to the first embodiment.
Figure 6:
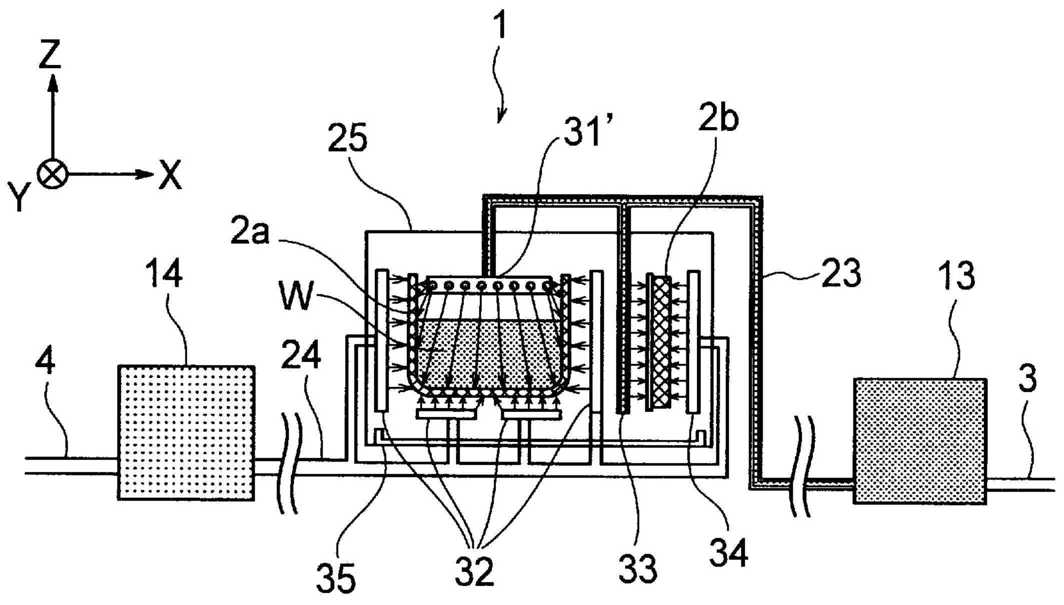
FIG. 6 is a cross-sectional view illustrating the second example of the configuration of the washing device according to the first embodiment.

FIGS. 5 and 6 are a plan view and a cross-sectional view illustrating a second example of the configuration of the washing device 1 according to the first embodiment, respectively.

In the same manner as in FIGS. 3 and 4, FIGS. 5 and 6 illustrate any washing unit 25 illustrated in FIG. 1 and the configuration relating to the washing unit 25. The washing unit 25 includes a hot water nozzle 31' instead of the hot water nozzle 31. The hot water nozzle 31' is an example of the first washing unit.

The capacitance of the FOUP 2 according to the present embodiment is about 20 L. Therefore, when the water heated by the heating unit 13 is accumulated in the FOUP main body 2*a*, it takes a long period of time for the water level to rise in the FOUP main body 2*a*. As a result, there is a large time difference between a time when the water accumulated in the FOUP main body 2*a* heats a part near the bottom portion of the FOUP main body 2*a* and a time when the water heats a part near the opening of the FOUP main body 2*a*. Therefore, there is concern that the part near the opening of the FOUP main body 2*a* is not sufficiently heated.

Therefore, the washing unit 25 illustrated in FIGS. 5 and 6 pours the water heated by the heating unit 13 from the hot water nozzle 31' into the FOUP main body 2*a* in the form of a shower. The hot water nozzle 31' has a structure of a shower head, and the water from the hot water nozzle 31' is poured to the entire inner surface of the FOUP main body 2*a*. Therefore, the part near the opening of the FOUP main body 2*a* is heated before being exposed to the water accumulated in the FOUP main body 2*a*. Accordingly, the entire inner surface of the FOUP main body 2*a* can be evenly heated.

In addition, such a problem of unevenness in heating can be handled by increasing the flow rate of the water dispensed from the hot water nozzle 31 or the hot water nozzle 31' to reduce the time difference.

Here, the effect of hot water washing is described.

Generally, the solubility rate of gases in water is higher in hot water than in cold water. Therefore, the FOUP 2 according to the present embodiment is washed by using hot water. Accordingly, the gas adsorbed in the front surface of the FOUP 2 can be efficiently removed. It is noted that, the gas adsorbed in the front surface of the FOUP 2 can be removed even with cold water, and thus the effect of using hot water is not capability of removing the gas that cannot be removed with cold water with hot water but efficient removal of the gas that can be removed even with cold water with hot water.

The gas impregnated into the polymer that forms the FOUP 2 is hardly removed only by simply washing the FOUP 2 with water. The reason is that diffusion of the gas in the polymer is rate-limited. It is known that, if the temperature of the polymer increases, vacancies in macromolecular chains of the polymer increase, and thus the diffusion of the gas becomes faster. Accordingly, if the FOUP 2 is washed by using hot water, the polymer is heated by hot water to increase the temperature of the polymer so that the diffusion of the gas becomes faster. Accordingly, the gas impregnated into the polymer can be diffused to the front surface of the FOUP 2. According to the present embodiment, the gas impregnated into the polymer can be removed by washing the FOUP 2 with hot water and diffusing the gas impregnated into the polymer to the front surface of the FOUP 2.

The gas impregnated into the polymer can be removed, for example, also by vacuum heating the FOUP 2. However, in the vacuum heating, it is difficult to efficiently remove the gas that is diffused to the front surface of the FOUP 2. Meanwhile, according to the present embodiment, the gas diffused to the front surface of the FOUP 2 can be dissolved in hot water by exposing the front surface of the FOUP 2 to hot water, and thus the gas diffused to the front surface of the FOUP 2 can be efficiently removed.

Figure 7:
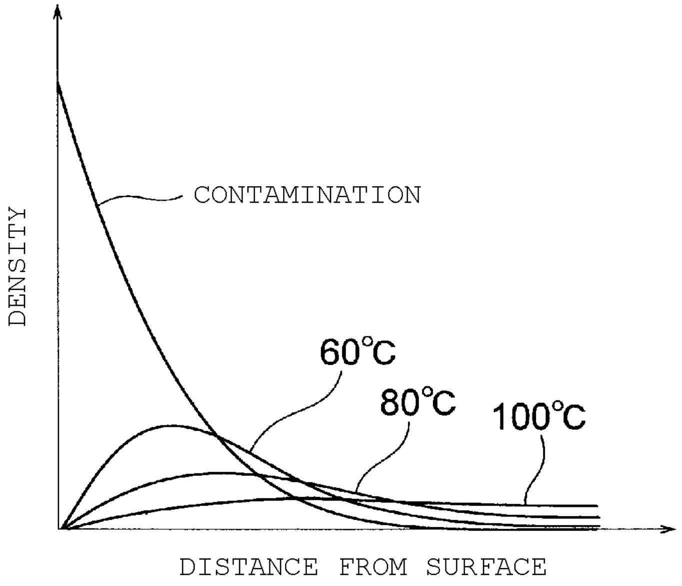
FIG. 7 is a graph illustrating washing of a FOUP according to the first embodiment.

FIG. 7 is a graph illustrating washing of the FOUP 2 according to the first embodiment.

The horizontal axis in FIG. 7 indicates the distance of the FOUP 2 from the front surface. The vertical axis in FIG. 7 indicates the concentration of gas in the FOUP 2. FIG. 7 illustrates the gas concentration distribution before washing with hot water (contaminated state) and the gas concentration distribution after washing with hot water of 60° C., 80° C., or 100° C.

In the distribution before washing, the gas concentration on the front surface of the FOUP 2 is the highest, and the gas concentration decreases as it goes far from the front surface of the FOUP 2. Meanwhile, in each distribution after the washing, the gas is removed from the front surface of the FOUP 2, and thus the gas concentration of the front surface of the FOUP 2 becomes zero.

When the front surface of the FOUP 2 is washed with hot water, the gas concentration of the front surface of the FOUP 2 decreases, the gas in the FOUP 2 is diffused toward the front surface of the FOUP 2. It is noted that, when the temperature of the hot water is less than 70° C. (for example, 60° C.), the diffusion coefficient of the gas is small, and thus the concentration of the gas in the FOUP 2 does not decrease so much. Alternatively, when the temperature of the hot water is 70° C. or higher (for example, 80° C. or 100° C.), the diffusion coefficient of the gas becomes large, and thus the concentration of the gas in the FOUP 2 greatly decreases. The reason is that, if the diffusion coefficient of the gas becomes large, the gas in the FOUP 2 is efficiently removed from the front surface of the FOUP 2. In this manner, according to the present embodiment, if the temperature of the hot water for washing the FOUP 2 increases, the gas in the FOUP 2 can be efficiently removed.

In addition, as understood from the comparison with the distributions of 60° C., 80° C., and 100° C., the position of the peak of the gas concentration distribution after washing is farther from the front surface of the FOUP 2, as the temperature of the hot water increases. Though entering the FOUP 2, the gas diffused to a position far from the front surface of the FOUP 2 hardly comes out of the FOUP 2 at the temperature at which the FOUP 2 is used (a temperature near room temperature). Therefore, the gas diffused to the position far from the front surface of the FOUP 2 does not have a problem that the gas is bled out from the polymer, and thus there is no problem in the practical operation of the FOUP 2.

Figure 8:
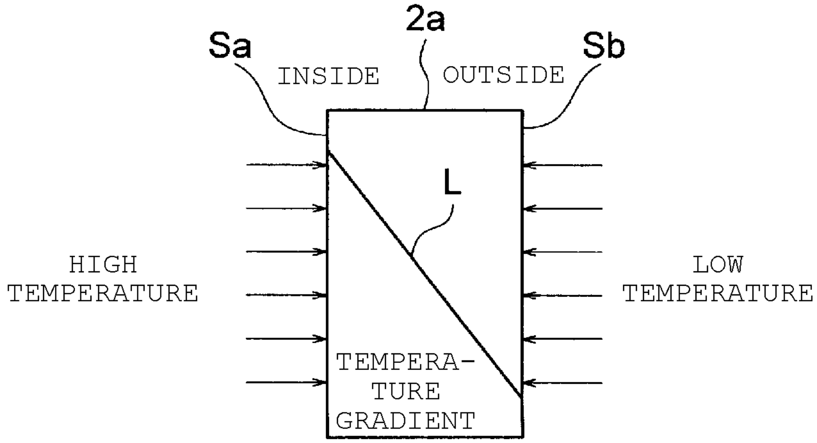
FIG. 8 is a schematic view illustrating washing of the FOUP according to the first embodiment.

FIG. 8 is a schematic view illustrating the washing of the FOUP 2 according to the first embodiment. With reference to FIG. 8, a problem when the temperature of the washing water is increased is described.

In a case of a polymer having a thickness of about 5 mm, if the front surface of the polymer is heated, the entire polymer is heated, immediately. Generally, in the polymer that forms the FOUP 2, thermal decomposition starts at 130° C. or higher and the composition is not changed at about 80° C. However, it is known that, in the polymer that forms the FOUP 2, thermal movement of macromolecular frames occurs even at about 80° C., and thus the internal gap is widened and softened.

The state of the polymer microscopically returns to the original state when the temperature is lowered again. However, if force is applied to the FOUP 2 in a state in which the polymer that forms the FOUP 2 is softened, the FOUP 2 is deformed. Also, if the temperature of the FOUP 2 is lowered again in a state in which the FOUP 2 is deformed, the FOUP 2 remains deformed, and the shape of the FOUP 2 cannot return to the original shape.

The FOUP 2 has a complicated shape, and the application of force to the FOUP 2 by the own weight is not even. In addition, strain formed when the FOUP 2 was processed and molded slightly remains in the FOUP 2. Therefore, if the FOUP 2 is heated and deformed, the shape of the FOUP 2 hardly returns to the original state. If the shape of the FOUP 2 changes even slightly, the height at which the substrate is placed in the FOUP 2 changes, and thus conveyance troubles easily occur. Therefore, it is preferable to prevent even slight deformation of the FOUP 2.

As illustrated in FIG. 8, the washing unit 25 according to the present embodiment not only heats an inner surface Sa of the FOUP main body 2*a* with hot water but also cools an outer surface Sb of the FOUP main body 2*a* with cold water. Similarly, the washing unit 25 according to the present embodiment not only heats the rear surface of the FOUP door 2*b* with hot water but also cools the front surface of the FOUP door 2*b* with cold water.

As described above, in the polymer that forms the FOUP 2, a composition change does not occur at less than 130° C. Accordingly, when the FOUP 2 is heated with water less than 130° C., the heat deformation of the FOUP 2 can be prevented if the entire FOUP 2 is not heated. Therefore, the FOUP main body 2*a* illustrated in FIG. 8 is not only heated with hot water on the inner surface Sa side but also cooled with cold water on the outer surface Sb side. Accordingly, the temperature of the FOUP main body 2*a* can be made high in a part near the inner surface Sa where the gas exists in a high concentration and can be made not so high in the other parts.

FIG. 8 schematically illustrates a temperature gradient in the FOUP main body 2*a* with the straight line L in the FOUP main body 2*a*. According to the present embodiment, the temperature gradient as illustrated in FIG. 8 can be generated in the FOUP main body 2*a* by alternately heating and cooling the FOUP main body 2*a*. Accordingly, heating of the entire FOUP main body 2*a* can be prevented. The operation of alternately heating and cooling the FOUP main body 2*a* by the washing unit 25 is controlled by the control unit 15. The above is similarly applied when the washing unit 25 washes the FOUP door 2*b*.

Relating to the polymer that forms the FOUP 2, the heat resistance temperature of the polymer when being repeatedly used for a long period is, for example, about 70° C. Therefore, even if the temperature of the FOUP main body 2*a* is 70° C. or higher in a part near the inner surface Sa where the gas exists in a high concentration, it is preferable that the temperature is less than 70° C. in the other parts. According to the present embodiment, the thickness of the part where the temperature is 70° C. or higher can be made, for example, about 1 to 2 mm.

Figure 9:
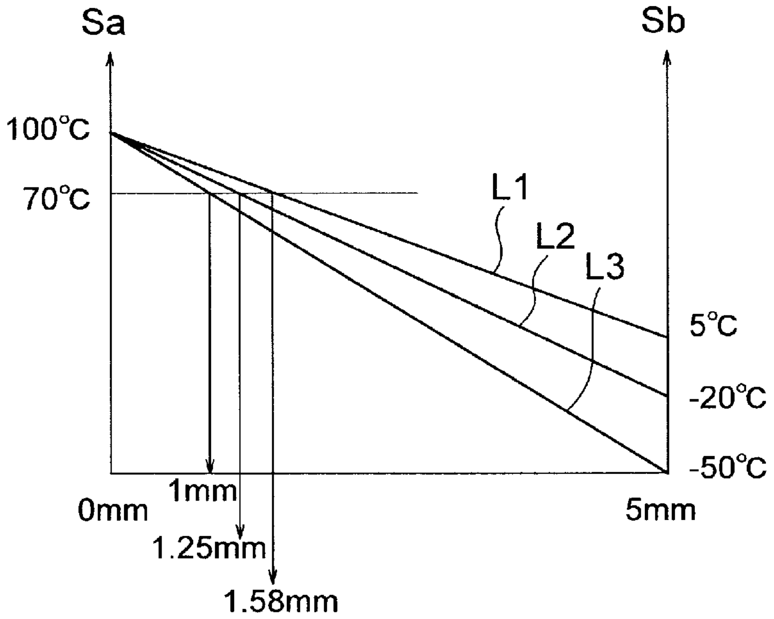
FIG. 9 is another graph illustrating the washing of the FOUP according to the first embodiment.

FIG. 9 is another graph illustrating the washing of the FOUP 2 according to the first embodiment.

FIG. 9 illustrates the temperature gradient when the inner surface Sa is heated so that the inner surface Sa of the FOUP main body 2*a* becomes 100° C., and the outer surface Sb is cooled so that the outer surface Sb of the FOUP main body 2*a* becomes 5° C., −20° C., or −50° C. A straight line L1 illustrates a case where the inner surface Sa is 100° C., and the outer surface Sb is 5° C. A straight line L2 illustrates a case where the inner surface Sa is 100° C., and the outer surface Sb is −20° C. A straight line L3 illustrates a case where the inner surface Sa is 100° C., and the outer surface Sb is −50° C. The horizontal axis of FIG. 9 indicates the distance from the inner surface Sa of the FOUP main body 2*a*, and the vertical axis of FIG. 9 indicates the temperature in the FOUP 2. In FIG. 9, thickness of the FOUP main body 2*a*, that is, the distance between the inner surface Sa and the outer surface Sb of the FOUP main body 2*a* is defined as 5 mm.

In addition, the setting of the inner surface Sa to 100° C. can be embodied, for example, by causing the water from the heating unit 13 to be vapor (vapor-like water). In addition, the setting of the outer surface Sb to be −20° C. or −50° C. can be embodied, for example, by dispensing liquid nitrogen instead of cold water or together with cold water to the outer surface Sb.

In a case of the straight lines L1 to L3, FIG. 9 illustrates the depth (the distance from the inner surface Sa) where the temperature in the FOUP main body 2*a* becomes 70° C. In a case of the straight line L1 (the inner surface Sa: 100° C., and the outer surface Sb: 5° C.), the temperature at the depth of 1.58 mm becomes 70° C. In a case of the straight line L2 (the inner surface Sa: 100° C., and the outer surface Sb: −20° C.), the temperature at the depth of 1.25 mm becomes 70° C. In a case of the straight line L3 (the inner surface Sa: 100° C., and the outer surface Sb: −50° C.), the temperature at the depth of 1 mm becomes 70° C. In this case, an even temperature gradient can be embodied in the FOUP main body 2*a* having the thickness of 5 mm.

The depth of 1.58 mm in a case of the straight line L1 is about ⅓ of the thickness (5 mm) of the FOUP main body 2*a*. As a result of the verification, if the temperature of a part of about two-thirds or more of the FOUP main body 2*a* is kept less than 70° C., heat deformation in the entire FOUP main body 2*a* can be prevented. Accordingly, the temperature of the water from the cooling unit 14 is preferably set to 10° C. or lower.

A part that is kept at less than 70° C. in the FOUP main body 2*a* can be further expanded by causing the temperature of the outer surface Sb to be 0° C. or lower. For example, if the temperature of the outer surface Sb is set to −20° C., a part of about three-fourths of the FOUP main body 2*a* is kept at less than 70° C. If the temperature of the outer surface Sb is brought to −50° C., a part of about four-fifth of the FOUP main body 2*a* is kept at less than 70° C. The setting of the temperature of the outer surface Sb to be 0° C. or lower can be embodied, for example, by dispensing liquid nitrogen by a liquid nitrogen spray to the outer surface Sb. In this case, the liquid nitrogen dispensed from the liquid nitrogen spray may reach the outer surface Sb as a liquid or may be changed into nitrogen gas before reaching the outer surface Sb. In addition, in a case of using liquid nitrogen, it is preferable to provide the washing unit 25 with a mechanism to release the pressure in the washing unit 25 so that the pressure in the washing unit 25 does not excessively rise due to vaporization of the liquid nitrogen.

When the washing unit 25 washes the FOUP main body 2*a*, it is preferable to heat and cool the FOUP main body 2*a* so that the temperature difference between the inner surface Sa and the outer surface Sb of the FOUP main body 2*a* becomes 70° C. or more. The temperature difference between the inner surface Sa and the outer surface Sb becomes 95° C. in a case of the straight line L1, 120° C. in a case of the straight line L2, and 150° C. in a case of the straight line L3. In these cases, sufficiently more parts of the FOUP main body 2*a* can be kept at less than 70° C., and thus, for example, a part of about two-thirds or more of the FOUP main body 2*a* can be kept at less than 70° C.

Accordingly, heat deformation of the entire FOUP main body 2*a* can be prevented. The above is similarly applied when the washing unit 25 washes the FOUP door 2*b*.

Figure 10:
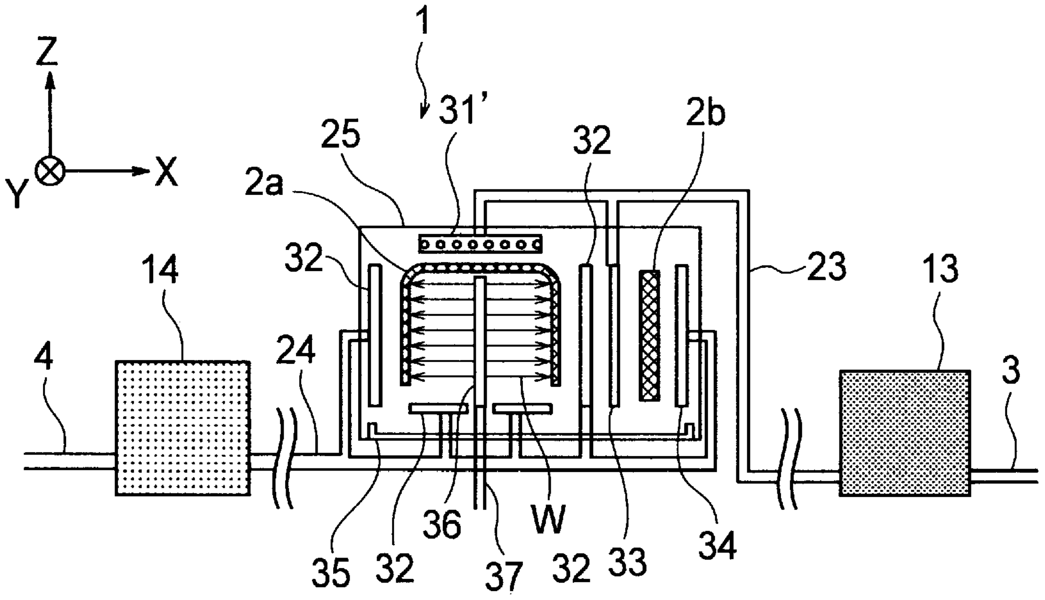
FIG. 10 is another cross-sectional view illustrating the second example of the configuration of the washing device according to the first embodiment.

FIG. 10 is another cross-sectional view illustrating the second example of the configuration of the washing device 1 according to the first embodiment.

The washing unit 25 illustrated in FIG. 10 includes a hot water nozzle 36 and a hot water channel 37 in addition to the components illustrated in FIG. 6. The hot water nozzle 36 dispenses the hot water supplied from the hot water channel 37 to the FOUP main body 2*a*. The hot water channel 37 supplies the hot water flowing through the hot water channel 3 (FIG. 1) to the hot water nozzle 36 without passing through the heating unit 13. The hot water nozzle 36 according to the present embodiment dispenses the hot water in the form of a shower.

Unlike the FOUP main body 2*a* illustrated in FIG. 6, the FOUP main body 2*a* illustrated in FIG. 10 is placed near the hot water nozzle 31 and the cold water nozzle 32 so that the bottom portion of the FOUP main body 2*a* faces upward, and the opening of the FOUP main body 2*a* faces downward. In the washing unit 25 in the second example (FIGS. 5, 6, and 10), after the FOUP main body 2*a* in a state illustrated in FIG. 6 is washed, the direction of the FOUP main body 2*a* is changed to the direction illustrated in FIG. 10.

Also, the hot water nozzle 36 is inserted into the FOUP main body 2*a*, and the inner surface of the FOUP main body 2*a* is washed with the hot water from the hot water nozzle 36. Accordingly, dusts attached to the inner surface of the FOUP main body 2*a* can be removed. In FIG. 10, since the opening of the FOUP main body 2*a* faces downward, the dusts can be prevented from being accumulated in the FOUP main body 2*a* together with the water. For effectively removing dusts from the inner surface of the FOUP main body 2*a*, the water pressure of the hot water dispensed from the hot water nozzle 36 may be increased, and the flow rate of the hot water may be increased by mixing gas (for example, nitrogen gas) with the hot water dispensed from the hot water nozzle 36. The dusts removed from the inner surface of the FOUP main body 2*a* drops into the drain pan 35 together with water and is thereafter discharged out of the washing device 1 together with the water. According to the present embodiment, the FOUP door 2*b* is washed with hot water, and thus the FOUP door 2*b* is not additionally washed, but the FOUP door 2*b* may be additionally washed for the purpose of dust removal.

In addition, the hot water nozzle 36 and the hot water channel 37 may be provided not only in the washing unit 25 in the second example but also in the washing unit 25 in the first example (FIGS. 3 and 4). In addition, the cold water nozzle 32, the hot water nozzle 33, and the cold water nozzle 34 in the first and second examples may dispense water not in the form of a shower like the hot water nozzle 31 or may dispense water in the form of a shower like the hot water nozzle 31'. It is noted that, it is not assumed that the water dispensed from the cold water nozzle 32, the hot water nozzle 33, and the cold water nozzle 34 are accumulated in the FOUP main body 2*a* or the FOUP door 2*b*, and thus the cold water nozzle 32, the hot water nozzle 33, and the cold water nozzle 34 preferably dispense water in the form of a shower as illustrated in FIGS. 3 to 6.

As above, the washing device 1 according to the present embodiment includes the heating unit 13 that heats water for washing the FOUP 2 and the washing unit 25 that heats and washes the FOUP 2 by supplying water heated by the heating unit 13 to the FOUP 2. Therefore, according to the present embodiment, the FOUP 2 can be suitably washed. For example, not only the gas adsorbed in the FOUP 2 but also the gas impregnated into the FOUP 2 can be removed. In addition, by cooling the outer surface of the FOUP 2 while heating the inner surface of the FOUP 2, the FOUP 2 can be washed while the deformation of the FOUP 2 is prevented.

Second Embodiment

Figure 11:
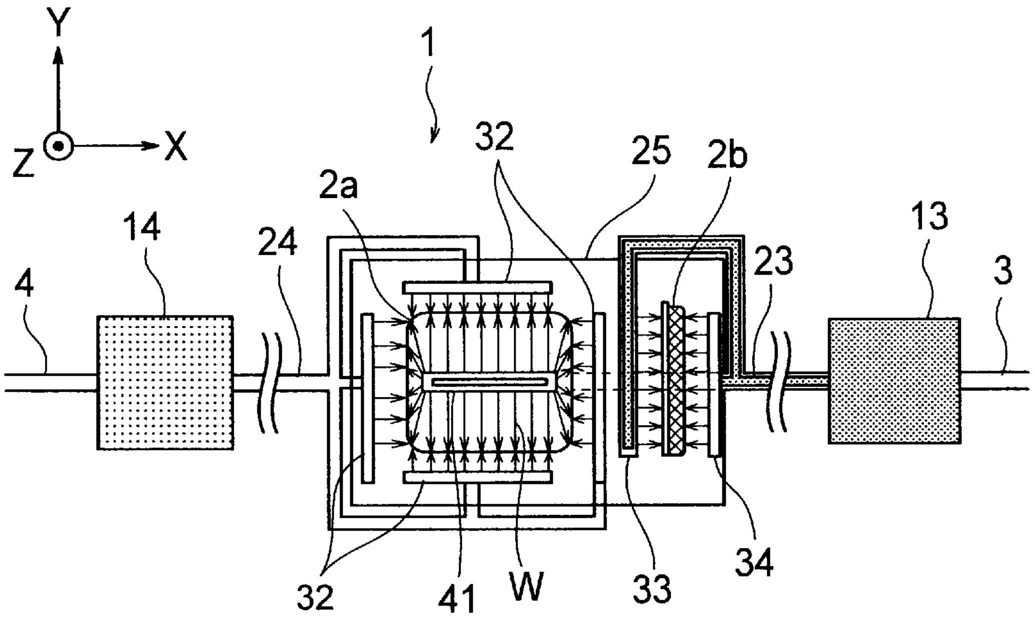
FIG. 11 is a plan view illustrating the configuration of a washing device according to a second embodiment.
Figure 12:
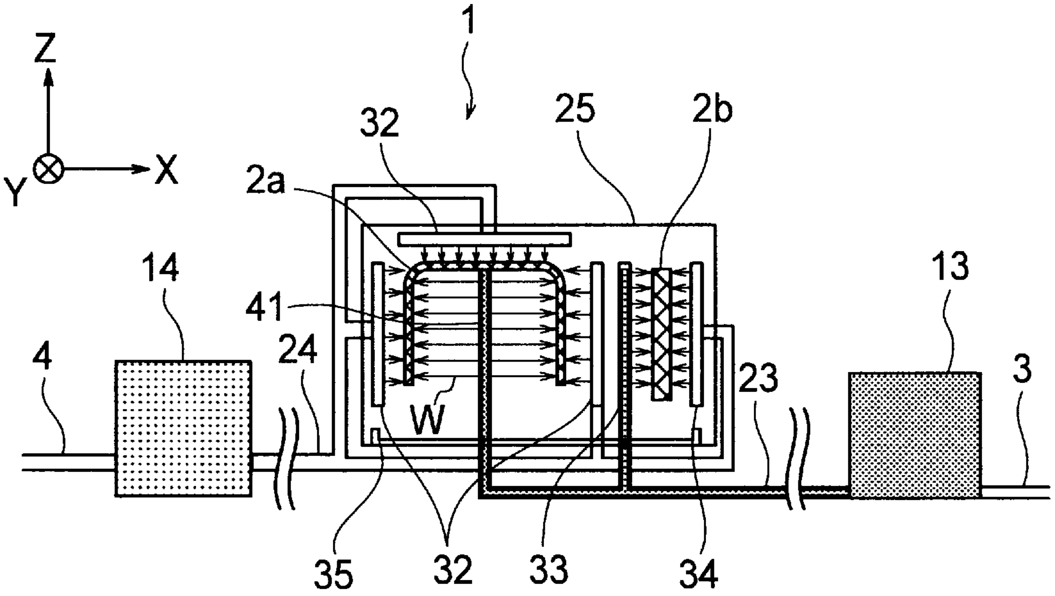
FIG. 12 is a cross-sectional view illustrating a configuration of the washing device according to the second embodiment.

FIGS. 11 and 12 are a plan view and a cross-sectional view illustrating the configuration of the washing device 1 according to a second embodiment, respectively.

Like FIGS. 3 and 4 and the like, FIGS. 11 and 12 illustrate any one of the washing units 25 illustrated in FIG. 1 and the configurations relating to the washing unit 25. This washing unit 25 includes a hot water nozzle 41 instead of the hot water nozzle 31. The hot water nozzle 41 heats and washes the FOUP main body 2*a* by supplying water heated by the heating unit 13 to the FOUP main body 2*a*. The hot water nozzle 41 is an example of the first washing unit.

Like the FOUP main body 2*a* illustrated in FIG. 10, the FOUP main body 2*a* illustrated in FIG. 12 is placed near the hot water nozzle 41 and the cold water nozzle 32 so that the bottom portion of the FOUP main body 2*a* faces upward, and the opening of the FOUP main body 2*a* faces downward. It is noted that, while the hot water nozzle 36 illustrated in FIG. 10 is used for dust removal, the hot water nozzle 41 illustrated in FIG. 12 is used for gas removal and dust removal. According to the present embodiment, by using the hot water nozzle 41, the gas removal and the dust removal can be simultaneously performed. In other words, the hot water nozzle 41 can exhibit the function of the hot water nozzles 31 and 31' for gas removal and the function of the hot water nozzle 36 for dust removal.

For washing the FOUP main body 2*a*, the inner surface of the FOUP main body 2*a* is washed with hot water from the hot water nozzle 41, and the outer surface of the FOUP main body 2*a* is washed with cold water from the cold water nozzle 32. Accordingly, as in the case of the first embodiment, while the FOUP main body 2*a* is heated and cooled, the FOUP main body 2*a* can be washed. Like the hot water nozzle 36, the hot water nozzle 41 is used in a state of being inserted into the FOUP main body 2*a*. The hot water nozzle 41 according to the present embodiment dispenses hot water in the form of a shower.

In FIG. 12, since the opening of the FOUP main body 2*a* faces downward, the water or the dusts can be prevented from being accumulated in the FOUP main body 2*a*. For effectively removing dusts from the inner surface of the FOUP main body 2*a*, the water pressure of the hot water dispensed from the hot water nozzle 41 may be increased, or the flow rate of the hot water may be increased by mixing gas (for example, nitrogen gas) with the hot water dispensed from the hot water nozzle 41.

According to the present embodiment, dust removal can be performed simultaneously with gas removal, and thus a time required for washing can be reduced. In addition, according to the present embodiment, since the direction of the FOUP main body 2*a* does not need to be changed, a conveyance mechanism of the FOUP main body 2*a* can be simplified.

According to the first and second embodiments, the rear surface of the FOUP door 2*b* is cooled with cold water. However, the FOUP door 2*b* has a latch structure for fixing to the FOUP main body 2*a* and thus has a cavity structure, so that the cooling from the rear surface of the FOUP door 2*b* cannot be effectively performed more than the FOUP main body 2*a*. It is noted that, since the shape of the FOUP door 2*b* is flat and simple, the FOUP door 2*b* receives the influences of the own weight and processing distortion described above less than the FOUP main body 2*a*. Therefore, the FOUP door 2*b* receives smaller influence of the deformation by the heating than the FOUP main body 2*a*. Accordingly, when the FOUP door 2*b* is formed in the condition of not being deformed even by heating at 70° C. or higher, the FOUP door 2*b* may not be cooled from the rear surface.

Third Embodiment

Figure 13:
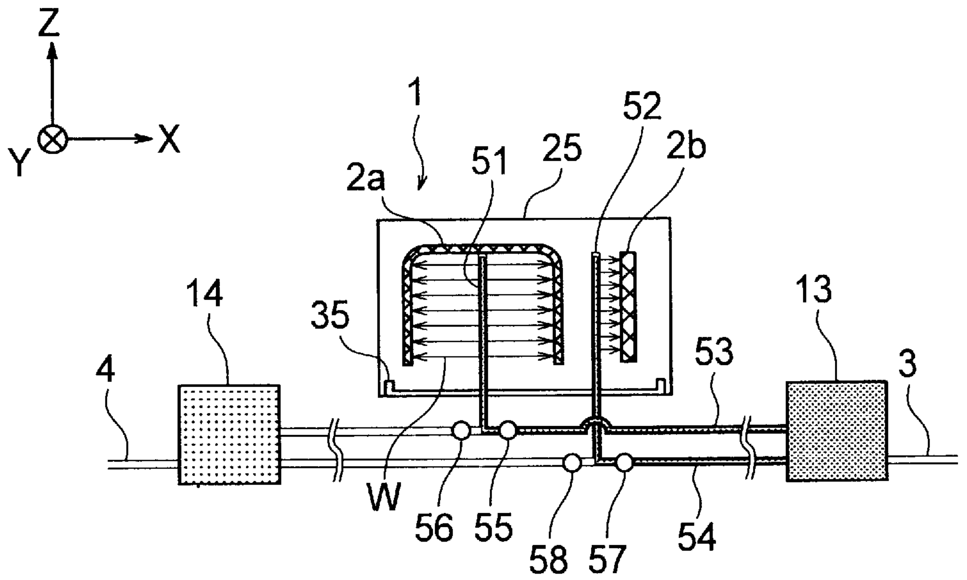
FIG. 13 is a cross-sectional view illustrating the configuration of the washing device according to a third embodiment.

FIG. 13 is a cross-sectional view illustrating the configuration of the washing device 1 according to a third embodiment.

Like FIGS. 3 and 4 and the like, FIG. 13 illustrates any one of the washing units 25 illustrated in FIG. 1 and the configurations relating to the washing units 25. The washing unit 25 includes a nozzle 51 and a nozzle 52 instead of the hot water nozzle 31, the cold water nozzle 32, the hot water nozzle 33, and the cold water nozzle 34. In addition, the washing device 1 according to the present embodiment includes a channel 53, a channel 54, a valve 55, a valve 56, a valve 57, and a valve 58, instead of the hot water channel 23 and the cold water channel 24. The nozzle 51 is an example of the first washing unit. The nozzle 52 is an example of the second washing unit.

The washing unit 25 according to the first or second embodiment washes the FOUP 2 by alternately heating and cooling the FOUP 2. Meanwhile, the washing unit 25 according to the present embodiment washes the FOUP 2 by alternately heating and cooling the FOUP 2. The operation of alternately heating and cooling the FOUP 2 by the washing unit 25 is controlled by the control unit 15 (FIG. 1).

The nozzle 51 washes the FOUP main body 2*a* by dispensing water to the inner surface of the FOUP main body 2*a*. The nozzle 51 can dispense water (hot water) heated by the heating unit 13 and dispense water (cold water) cooled by the cooling unit 14. When the nozzle 51 dispenses hot water, the FOUP main body 2*a* is washed while being heated. When the nozzle 51 dispenses cold water, the FOUP main body 2*a* is washed while being cooled. When the FOUP main body 2*a* according to the present embodiment is washed, the inner surface of the FOUP main body 2*a* is washed with hot water or cold water from the nozzle 51. Accordingly, gas removal and dust removal can be simultaneously performed. The nozzle 51 is used in a state of being inserted into the FOUP main body 2*a*. The nozzle 51 according to the present embodiment dispenses hot water or cold water in the form of a shower.

The nozzle 52 washes the FOUP door 2*b* by dispensing water to the rear surface of the FOUP door 2*b*. The nozzle 52 can dispense water (hot water) heated by the heating unit 13 and dispense water (cold water) cooled by the cooling unit 14. When the nozzle 52 dispenses hot water, the FOUP door 2*b* is washed while being heated. When the nozzle 52 dispenses cold water, the FOUP door 2*b* is washed while being cooled. The nozzle 52 according to the present embodiment dispenses hot water or cold water in the form of a shower.

The channel 53 is a channel for supplying water heated by the heating unit 13 and water cooled by the cooling unit 14 to the nozzle 51. As illustrated in FIG. 13, the channel 53 includes a hot water channel provided with the valve 55, a cold water channel provided with the valve 56, and a common channel obtained by merging the hot water channel and the cold water channel. The hot water channel, the cold water channel, and the common channel are connected to the heating unit 13, the cooling unit 14, and the nozzle 51, respectively. When hot water is dispensed from the nozzle 51, the valve 55 is opened, and the valve 56 is closed. When cold water is dispensed from the nozzle 51, the valve 55 is closed, and the valve 56 is opened. The opening and closing of the valves 55 and 56 are controlled by the control unit 15 (FIG. 1).

The channel 54 is a channel for supplying water heated by the heating unit 13 and water cooled by the cooling unit 14 to the nozzle 52. As illustrated in FIG. 13, the channel 54 includes a hot water channel provided with the valve 57, a cold water channel provided with the valve 58, and a common channel obtained by merging the hot water channel and the cold water channel. The hot water channel, the cold water channel, and the common channel are connected to the heating unit 13, the cooling unit 14, and the nozzle 52, respectively. When hot water is dispensed from the nozzle 52, the valve 57 is opened, and the valve 58 is closed. When cold water is dispensed from the nozzle 52, the valve 57 is closed, and the valve 58 is opened. The opening and closing of the valves 57 and 58 are controlled by the control unit 15 (FIG. 1).

Figure 14:
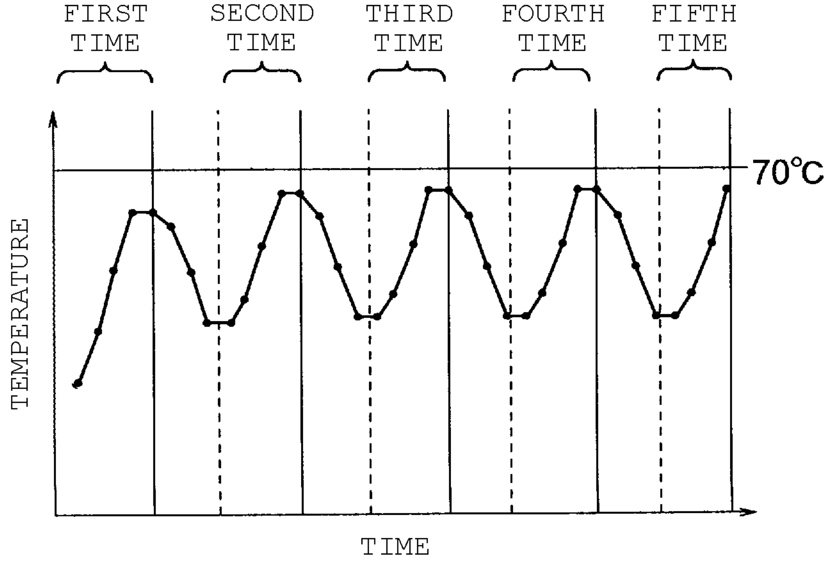
FIG. 14 is a graph illustrating an operation of the washing device according to the third embodiment.

FIG. 14 is a graph illustrating the operation of the washing device 1 according to the third embodiment.

The horizontal axis of FIG. 14 indicates the time (timing) when hot water or cold water is dispensed from the nozzle 51. The vertical axis of FIG. 14 indicates the temperature at a location at a depth of 1 mm from the front surface of the FOUP main body 2*a* in the FOUP main body 2*a*.

The periods of a "first time", a "second time", a "third time", a "fourth time", and a "fifth time" illustrated in FIG. 14 indicate timings of dispensing hot water from the nozzle 51. Meanwhile, the other periods illustrated in FIG. 14 indicate timings when cold water is dispensed from the nozzle 51. In this manner, the nozzle 51 according to the present embodiment alternately dispenses hot water and cold water. This is similarly applied to the nozzle 52 according to the present embodiment.

In FIG. 14, the temperature at the depth of 1 mm comes close to 70° C. but does not reach 70° C. at the end of each period of the "first time", the "second time", the "third time", the "fourth time", and the "fifth time". According to the present embodiment, like the case of the first embodiment (FIG. 9), a sufficiently large part of the FOUP main body 2*a* can be kept at less than 70° C.

According to the present embodiment, the washing unit 25 can be miniaturized by reducing the number of nozzles for washing water or shortening the length of the channel for washing water. Meanwhile, according to the first or second embodiment, the time required for washing the FOUP 2 can be shortened by alternately heating and cooling the FOUP 2 compared with a case where the FOUP 2 is alternately heated and cooled.

In addition, each washing unit 25 according to the first to third embodiments may capture hot water (water for heating) from the hot water channel 3 and capture cold water (water for cooling) from the cold water channel 4 or may capture water for heating and water for cooling from the same channel. In this case, the heating unit 13 heats water from this channel, and the cooling unit 14 cools water from this channel.

Fourth Embodiment

Figure 15:
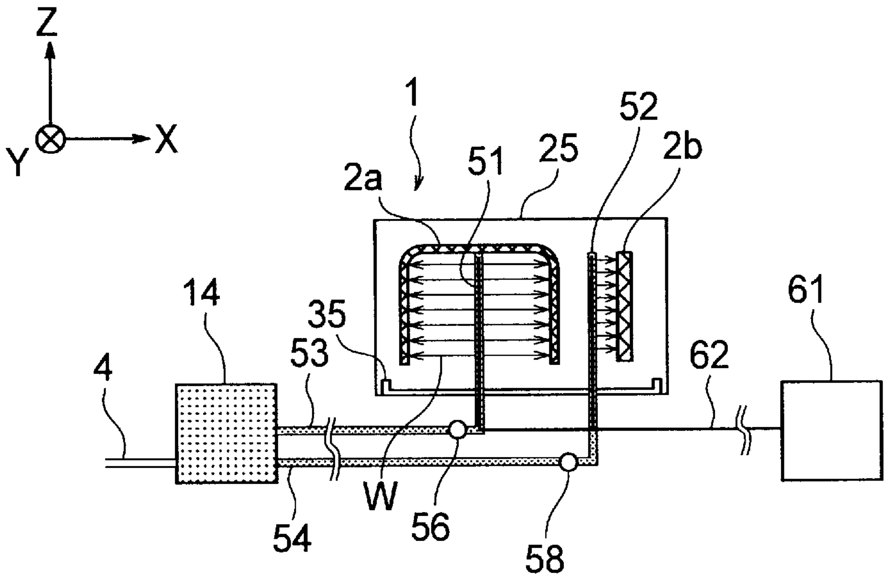
FIG. 15 is a cross-sectional view illustrating the configuration of a washing device according to a fourth embodiment.

FIG. 15 is a cross-sectional view illustrating the configuration of the washing device 1 according to a fourth embodiment.

Like FIG. 13, FIG. 15 illustrates a configuration relating to any one of the washing units 25 illustrated in FIG. 1, and the configurations relating to the washing units 25. The washing device 1 according to the present embodiment has a configuration similar to the washing device 1 according to the third embodiment but includes a current supply unit 61 and a current supply path 62 instead of the heating unit 13, the hot water channel in the channel 53, the hot water channel in the channel 54, the valve 55, and the valve 57.

The washing unit 25 according to the third embodiment heats and washes the FOUP 2 by dispensing hot water to the FOUP 2 and cools and washes the FOUP 2 by dispensing cold water to the FOUP 2. The washing unit 25 according to the present embodiment heats the FOUP 2 by irradiating the FOUP 2 with infrared light and cools and washes the FOUP 2 by dispensing cold water to the FOUP 2. As in the third embodiment, the washing unit 25 according to the present embodiment washes the FOUP 2 by alternately heating and cooling the FOUP 2. The operation of alternately heating and cooling the FOUP 2 by the washing unit 25 is controlled by the control unit 15 (FIG. 1).

The nozzle 51 according to the present embodiment washes the FOUP main body 2*a* by dispensing the water to the inner surface of the FOUP main body 2*a*. The nozzle 51 according to the present embodiment can wash the FOUP main body 2*a* while cooling by dispensing the water cooled by the cooling unit 14.

The nozzle 52 according to the present embodiment washes the FOUP door 2*b* by dispensing the water to the rear surface of the FOUP door 2*b*. The nozzle 52 according to the present embodiment can wash the FOUP door 2*b* while cooling, by dispensing the water cooled by the cooling unit 14.

As described below, the washing unit 25 according to the present embodiment includes a heating resistor 65 provided near the nozzle 51 and the heating resistor 65 provided near the nozzle 52. The current supply unit 61 supplies the current flowing through these heating resistors 65. The current supply path 62 is a path for supplying the current supplied from the current supply unit 61 to these heating resistors 65. When the current supplied from the current supply path 62 flows through these heating resistors 65, infrared light is generated from these heating resistors 65, and the inner surface of the FOUP main body 2*a* and the rear surface of the FOUP door 2*b* are irradiated with the infrared light. As a result, the FOUP main body 2*a* or the FOUP door 2*b* is heated by the infrared light. The current supply path 62 is, for example, a conductor for transmitting a current. As illustrated in FIG. 15, the current supply path 62 according to the present embodiment is provided along the channel 53 and the nozzle 51, or the channel 54 and the nozzle 52.

The channel 53 according to the present embodiment supplies the water cooled by the cooling unit 14 to the nozzle 51. When the water is dispensed from the nozzle 51, the valve 56 is opened, and the current supply from the current supply unit 61 is turned off. Meanwhile, when the FOUP main body 2*a* is heated, the valve 56 is closed, and the current supply from the current supply unit 61 is turned on. The opening and closing of the valve 56 or the turning on and off of the current supply unit 61 are controlled by the control unit 15 (FIG. 1).

The channel 54 according to the present embodiment supplies the water cooled by the cooling unit 14 to the nozzle 52. When the water is dispensed from the nozzle 52, the valve 58 is opened, and the current supply from the current supply unit 61 is turned off. Meanwhile, when the FOUP door 2*b* is heated, the valve 58 is closed, and the current supply from the current supply unit 61 is turned on. The opening and closing of the valve 58 or the turning on and off of the current supply unit 61 is controlled by the control unit 15 (FIG. 1).

Figure 16:
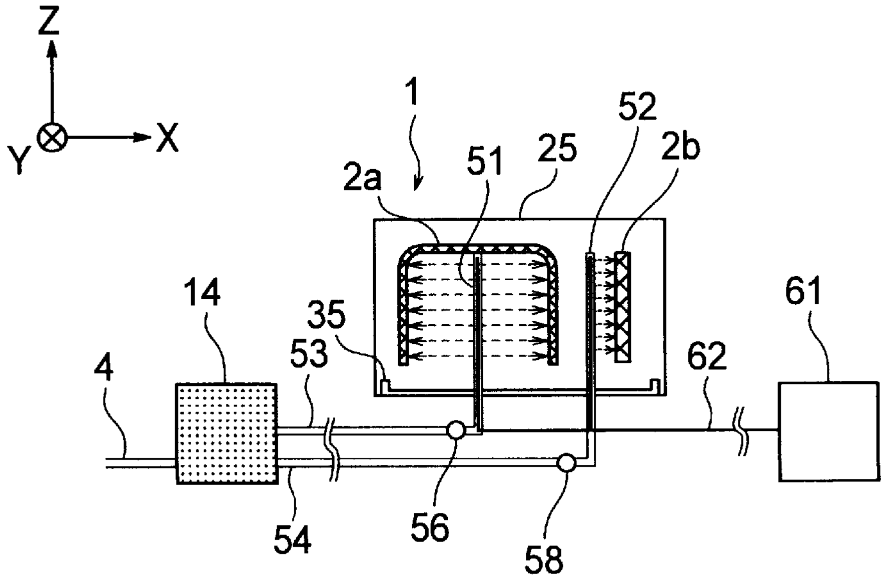
FIG. 16 is another cross-sectional view illustrating the configuration of the washing device according to the fourth embodiment.

FIG. 16 is another cross-sectional view illustrating the configuration of the washing device 1 according to the fourth embodiment.

FIG. 16 illustrates the washing unit 25 that is the same as the washing unit 25 illustrated in FIG. 15. FIG. 16 illustrates an aspect of irradiating the FOUP main body 2*a* or the FOUP door 2*b* with infrared light. Alternatively, FIG. 15 illustrates an aspect of dispensing water from the nozzles 51 and 52 to the FOUP main body 2*a* or the FOUP door 2*b*.

Figure 17:
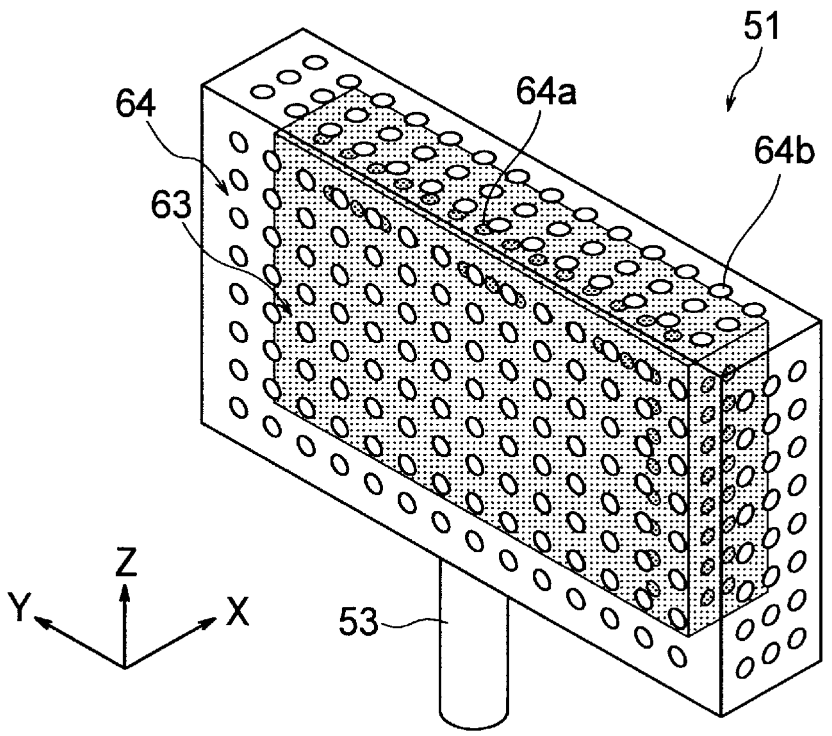
FIG. 17 is a perspective view illustrating a configuration of a nozzle according to the fourth embodiment.
Figure 18:
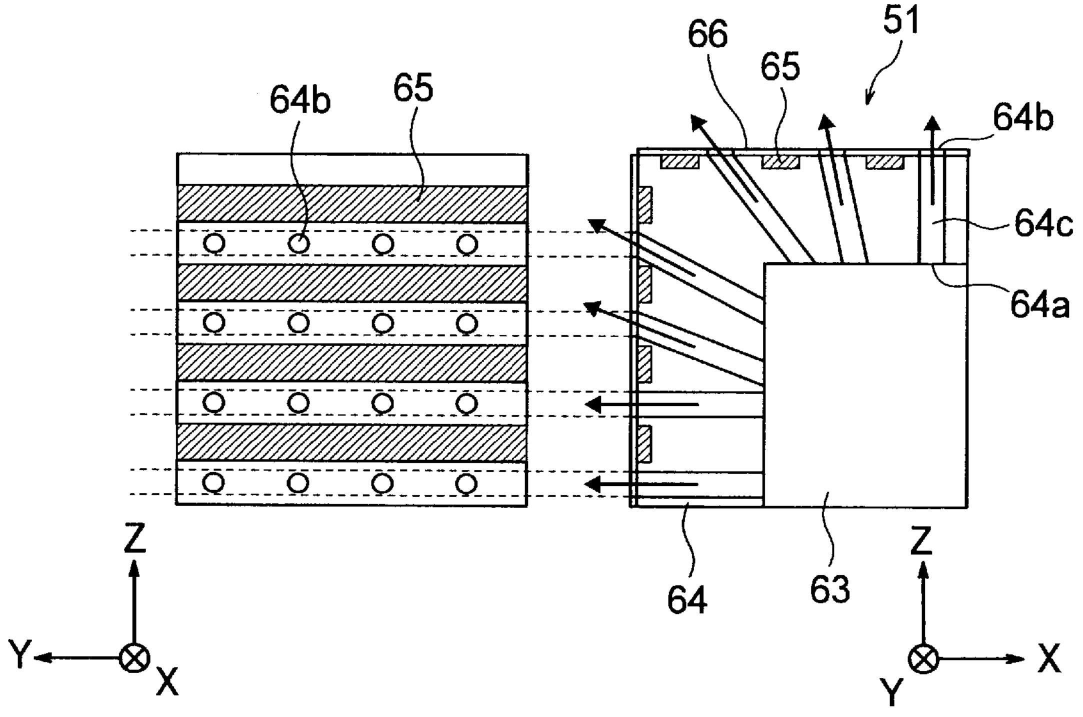
FIG. 18 is an enlarged view illustrating the configuration of the nozzle according to the fourth embodiment.

FIGS. 17 and 18 are a perspective view and an enlarged view illustrating the configuration of the nozzle 51 according to the fourth embodiment, respectively. The enlarged view of FIG. 18 includes a cross-sectional view illustrating an XZ cross section of the nozzle 51 and a side surface diagram illustrating the side surface of the nozzle 51 in the −X direction.

As illustrated in FIGS. 17 and 18, the nozzle 51 according to the present embodiment includes an internal space 63, a channel forming member 64, the plurality of heating resistors 65, and a glass material 66. FIG. 17 illustrates the internal space 63 with dot hatching to cause the position of the internal space 63 to be easily seen.

The water flowing from the channel 53 to the nozzle 51 is accumulated in the internal space 63. As illustrated in FIG. 18, the internal space 63 is formed by the channel forming member 64. The channel forming member 64 includes an outer surface formed with six squares and an inner surface formed with six squares, and the inner surface of the channel forming member 64 forms the internal space 63.

FIG. 17 illustrates a plurality of holes 64*a* provided on the outer surface of the channel forming member 64 and a plurality of holes 64*b* provided on the inner surface of the channel forming member 64. FIG. 18 illustrates a plurality of channels 64*c* that connect these holes 64*a* and 64*b* to each other. These channels 64*c* penetrate the channel forming member 64. In addition, in order to make the drawings easily seen, FIG. 17 omits the illustration of a portion of the holes 64*a*.

The water accumulated in the internal space 63 passes through these channels 64*c* and is dispensed to the FOUP main body 2*a*. In this manner, the nozzle 51 in the form of a shower is embodied. As illustrated in FIG. 18, these channels 64*c* extend in directions different from each other. Accordingly, the inner surface of the FOUP main body 2*a* can be washed so that the generation of unwashed parts is prevented.

Each heating resistor 65 avoids the positions of the holes 64*b* on the outer surface of the channel forming member 64. Each heating resistor 65 is electrically connected to the current supply path 62 (FIGS. 16 and 17) described above. Each heating resistor 65 can generate infrared light by being supplied with the current from the current supply path 62. As a result, infrared light is applied to the inner surface of the FOUP main body 2*a*, and thus the FOUP main body 2*a* is heated.

The glass material 66 covers the outer surface of the channel forming member 64 or the outer surface of each heating resistor 65. Accordingly, each heating resistor 65 can be prevented from coming into contact with water. The infrared light generated from each heating resistor 65 passes through the glass material 66 and is applied to the FOUP main body 2*a*. Meanwhile, the glass material 66 has holes at positions of the holes 64*b* of the channel forming member 64 so that the water from the holes 64*b* of the channel forming member 64 passes through the holes of the glass material 66.

In addition, the nozzle 52 according to the present embodiment has the configuration similar to the nozzle 51 illustrated in FIGS. 17 and 18.

Figure 19:
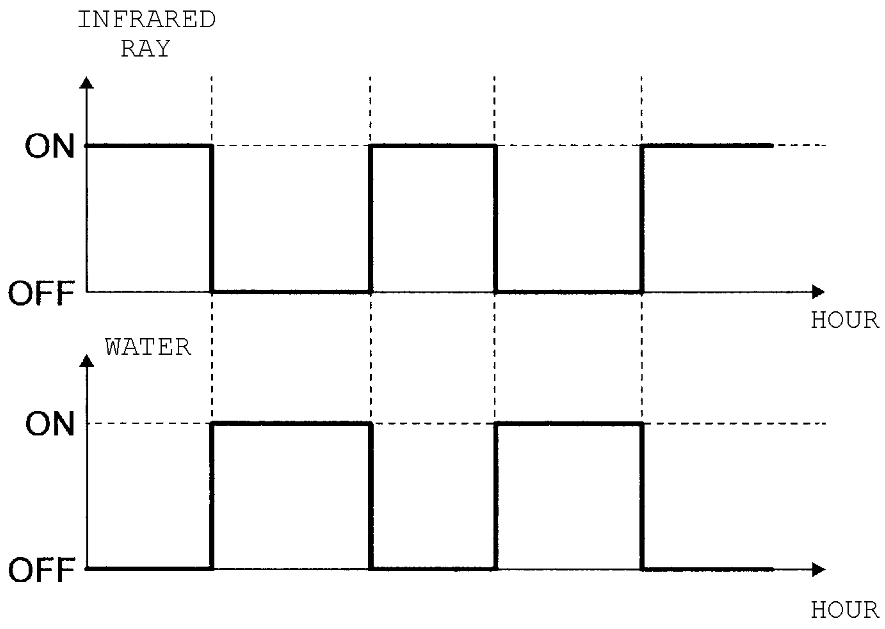
FIG. 19 is a graph illustrating an operation of a washing device according to the fourth embodiment.

FIG. 19 is a graph illustrating the operation of the washing device 1 according to the fourth embodiment.

FIG. 19 illustrates the time (timing) when cold water is dispensed from the nozzle 51, and the infrared light is generated from the heating resistor 65. As illustrated in FIG. 19, the washing unit 25 according to the present embodiment alternately cools the FOUP main body 2*a* with cold water and heats the FOUP main body 2*a* with infrared light. This is similarly applied to the FOUP door 2*b* according to the present embodiment.

The polymer that forms the FOUP 2 is, for example, polycarbonate. In this case, the polymer has a strong absorption band at a wavelength of 6 to 10 μm, and thus the infrared light applied to the FOUP 2 is absorbed near the front surface of the FOUP 2. As a result, the FOUP 2 is heated. However, it is preferable that the front surface temperature of the FOUP 2 does not become the temperature at which the polymer starts to be dissolved and decomposed (approximately 130° C.) or higher even for a short period of time. Therefore, the infrared irradiation energy and irradiation time need to be controlled to appropriate values.

When water is dispensed at the time of irradiation with the infrared light, the water absorbs the infrared light, and thus the FOUP 2 cannot be efficiently heated. Therefore, the irradiation with the infrared light according to the present embodiment is performed while water is not dispensed (see FIG. 19). According to the present embodiment, for dissolving and removing the gas bled out of the front surface of the FOUP 2, the water is dispensed to the FOUP 2 after the irradiation with the infrared light. At this time, in order to reduce the temperature near the front surface of the FOUP 2 once, cold water is dispensed to the FOUP 2 according to the present embodiment. Since the gas in the polymer does not come out of the front surface even if a water washing time is prolonged, and the gas on the front surface cannot be removed even if the infrared light irradiation time is prolonged, it is preferable that the water washing and the infrared light irradiation are alternately performed for a short period of time.

According to the present embodiment, the heating unit 13 becomes unnecessary, and thus the configuration of the washing device 1 can be simplified, and the washing device 1 can be miniaturized.

In addition, the heating resistor 65 according to the present embodiment is provided in the nozzle 51. Accordingly, the nozzle 51 that is a mechanism of dispensing water and the heating resistor 65 that is a mechanism of generating infrared light are integrated. Accordingly, it is possible to prevent the mechanism of dispensing water from interrupting the infrared light irradiation or the mechanism of generating the infrared light from interrupting the water dispensing. Furthermore, these mechanisms can be easily moved together.

Fifth Embodiment

Figure 20:
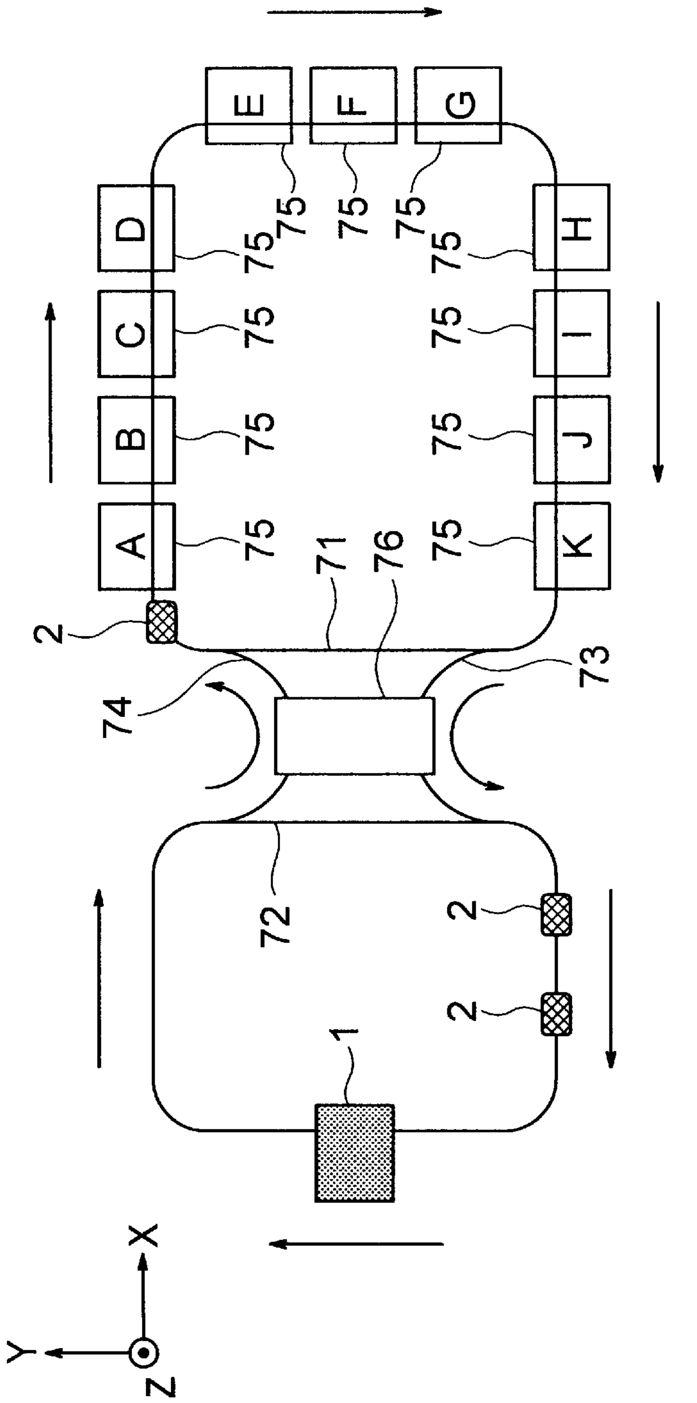
FIG. 20 is a plan view illustrating a configuration of a semiconductor manufacturing system according to a fifth embodiment.

FIG. 20 is a plan view illustrating the configuration of the semiconductor manufacturing system according to a fifth embodiment.

The semiconductor manufacturing system according to the present embodiment includes any one of the washing devices 1 according to the first to fourth embodiments, conveyance paths 71 to 74, a plurality of semiconductor manufacturing devices 75, and a substrate handling unit 76. FIG. 20 further illustrates the plurality of FOUPs 2 conveyed along the conveyance paths 71 to 74. Arrows illustrated in FIG. 20 indicate the conveyance direction of the FOUP 2.

The conveyance path 71 is a track used when the substrate is conveyed by the FOUP 2. The conveyance path 72 is a track used when the FOUP 2 is washed. Therefore, the conveyance path 71 is located adjacent to the semiconductor manufacturing device 75, and the conveyance path 72 is located adjacent to the washing device 1. When the substrate in the FOUP 2 is processed, the FOUP 2 on the conveyance path 71 is placed on any one of the semiconductor manufacturing devices 75. Alternatively, when the FOUP 2 is washed, the FOUP 2 on the conveyance path 72 is placed on the washing device 1.

The substrate handling unit 76 stores the substrate in the FOUP 2 and takes the substrate from the FOUP 2. For example, when the FOUP 2 faces the conveyance path 72 from the conveyance path 71 via the conveyance path 73, all substrates are taken from the FOUP 2. Alternatively, when the FOUP 2 faces the conveyance path 71 from the conveyance path 72 via the conveyance path 74, one or more substrates are stored in the FOUP 2.

The semiconductor manufacturing system according to the present embodiment can manufacture the semiconductor device from the substrate conveyed by the FOUP 2. The semiconductor device according to the present embodiment may be processed only in the semiconductor manufacturing system illustrated in FIG. 20, and may be processed in the semiconductor manufacturing system illustrated in FIG. 20 and another semiconductor manufacturing system.

FIG. 20 illustrates an example of the plurality of semiconductor manufacturing devices 75 denoted by reference numerals A to K. These semiconductor manufacturing devices 75 each include, for example, a chemical vapor deposition (CVD) device, a sputtering device, a dry etching device, an annealing device, a chemical mechanical polishing (CMP) device, an ion implantation device, and a device for washing and drying a substrate.

Figure 21:
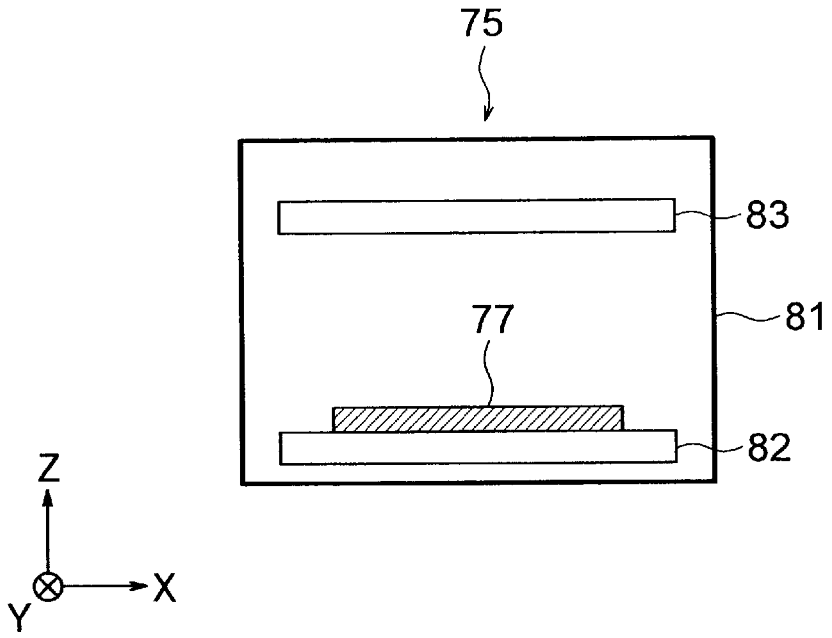
FIG. 21 is a cross-sectional view illustrating a first example of a configuration of a semiconductor manufacturing device according to the fifth embodiment.

FIG. 21 is a cross-sectional view illustrating a first example of the configuration of the semiconductor manufacturing device 75 according to the fifth embodiment.

The semiconductor manufacturing device 75 illustrated in FIG. 21 is a dry etching device and includes a chamber 81, a substrate holder 82, and an ion source 83. The substrate holder 82 holds a substrate 77 accommodated in the chamber 81. The ion source 83 performs dry etching on the substrate 77 by irradiating the substrate 77 with ions. If the substrate 77 is stored in the FOUP 2 after dry etching, the FOUP 2 is easily contaminated, for example, with gas such as fluorine gas and chlorine gas.

Figure 22:
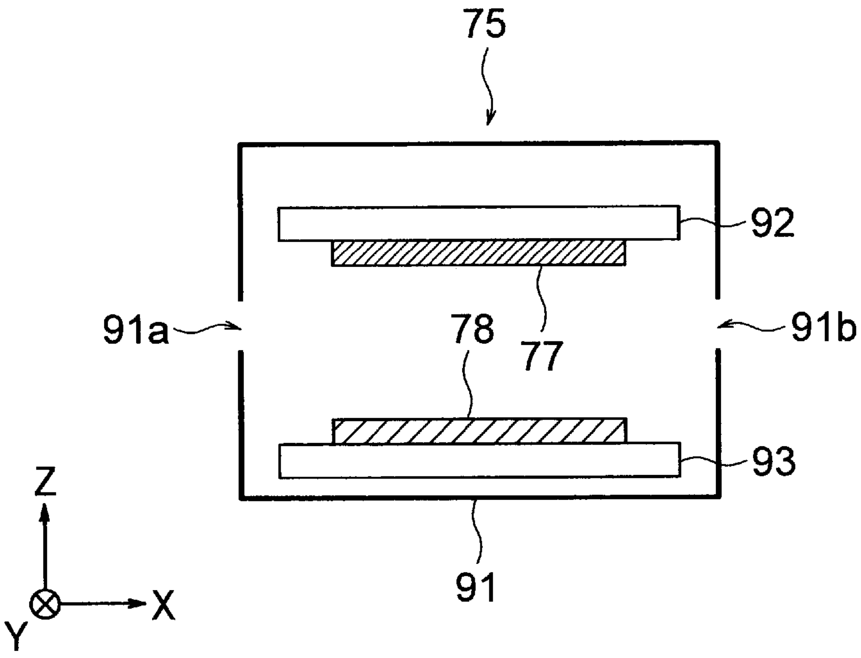
FIG. 22 is a cross-sectional view illustrating a second example of the configuration of the semiconductor manufacturing device according to the fifth embodiment.

FIG. 22 is a cross-sectional view illustrating a second example of the configuration of the semiconductor manufacturing device 75 according to the fifth embodiment.

The semiconductor manufacturing device 75 illustrated in FIG. 22 is a sputtering device, and includes the chamber 91, a substrate holder 92, and a target holder 93. The chamber 91 includes an air supply port 91*a* that supplies a gas for sputtering and an air exhaust port 91*b* that discharges unnecessary gas. The substrate holder 92 holds the substrate 77 accommodated in the chamber 91. The target holder 93 holds a target 78 for sputtering the substrate 77. It is preferable that the sputtering is performed in a state in which the substrate 77 is clean, and thus it is preferable that the FOUP 2 that stores the substrate 77 before the sputtering is also clean.

Figure 23:
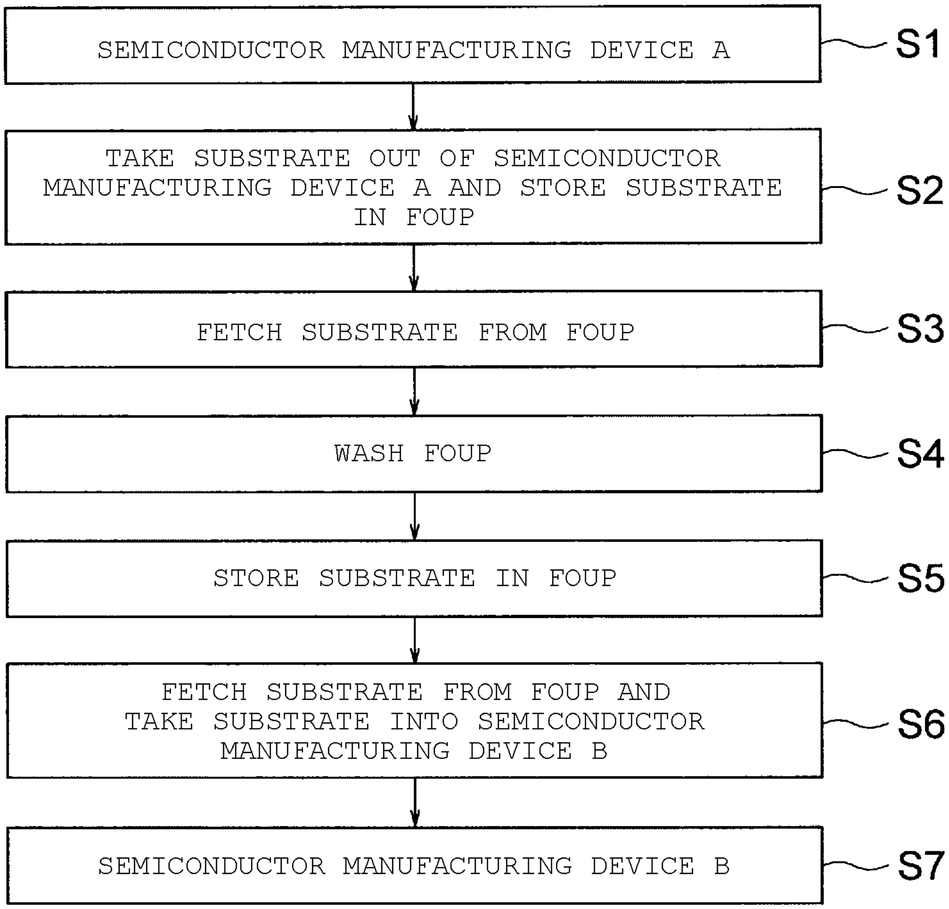
FIG. 23 is a flow chart illustrating an operation of a semiconductor manufacturing system according to the fifth embodiment.

FIG. 23 is a flow chart illustrating the operation of the semiconductor manufacturing system according to the fifth embodiment.

FIG. 23 illustrates a flow of processing the substrate 77 in a certain FOUP 2 by any one of the semiconductor manufacturing devices 75 and thereafter processing the substrate 77 in the FOUP 2 by the other semiconductor manufacturing device 75. In FIG. 23, the former device is the semiconductor manufacturing device 75 denoted by the reference numeral A (hereinafter, referred to as "a semiconductor manufacturing device A"), and the latter device is the semiconductor manufacturing device 75 denoted by the reference numeral B (hereinafter, referred to as a semiconductor manufacturing device B"). The semiconductor manufacturing device A is an example of a first semiconductor manufacturing device, the semiconductor manufacturing device B is an example of a second semiconductor manufacturing device.

In this case, the FOUP 2 may be preferably washed between the process in the semiconductor manufacturing device A and the process in the semiconductor manufacturing device B. For example, when the semiconductor manufacturing device A is the dry etching device, and the semiconductor manufacturing device B is the sputtering device, though the FOUP 2 is preferably clean before the process in the semiconductor manufacturing device B, the FOUP 2 is easily contaminated after the process in the semiconductor manufacturing device A. FIG. 23 illustrates a flow of dealing with such contamination.

First, the substrate 77 is processed in the semiconductor manufacturing device A (Step S1), the substrate 77 is thereafter taken out of the semiconductor manufacturing device A, and the taken-out substrate 77 is stored in the FOUP 2 (Step S2). The substrate 77 stored in Step S2 is an example of a first substrate. Next, the FOUP 2 is conveyed to the substrate handling unit 76, and the substrate 77 is taken from the FOUP 2 by the substrate handling unit 76 (Step S3). Next, this FOUP 2 is washed with the washing device 1 (Step S4).

Next, the FOUP 2 is conveyed to the substrate handling unit 76, and the substrate 77 is stored in the FOUP 2 by the substrate handling unit 76 (Step S5). The substrate 77 stored in Step S5 may be the same as the substrate 77 taken in Step S3 and may be different from the substrate 77 taken in Step S3. The substrate 77 stored in Step S5 is an example of a second substrate. Next, the FOUP 2 is moved to a position near the semiconductor manufacturing device B, the substrate 77 is taken from the FOUP 2, and the taken substrate 77 is taken into the semiconductor manufacturing device B (Step S6). Next, the substrate 77 is processed in the semiconductor manufacturing device B (Step S7).

According to the present embodiment, when the semiconductor manufacturing devices 75 that easily contaminate the FOUP 2 exists in the semiconductor manufacturing system, the FOUP 2 can be kept clean.

Sixth Embodiment

Figures 24A, 24B, 24C:
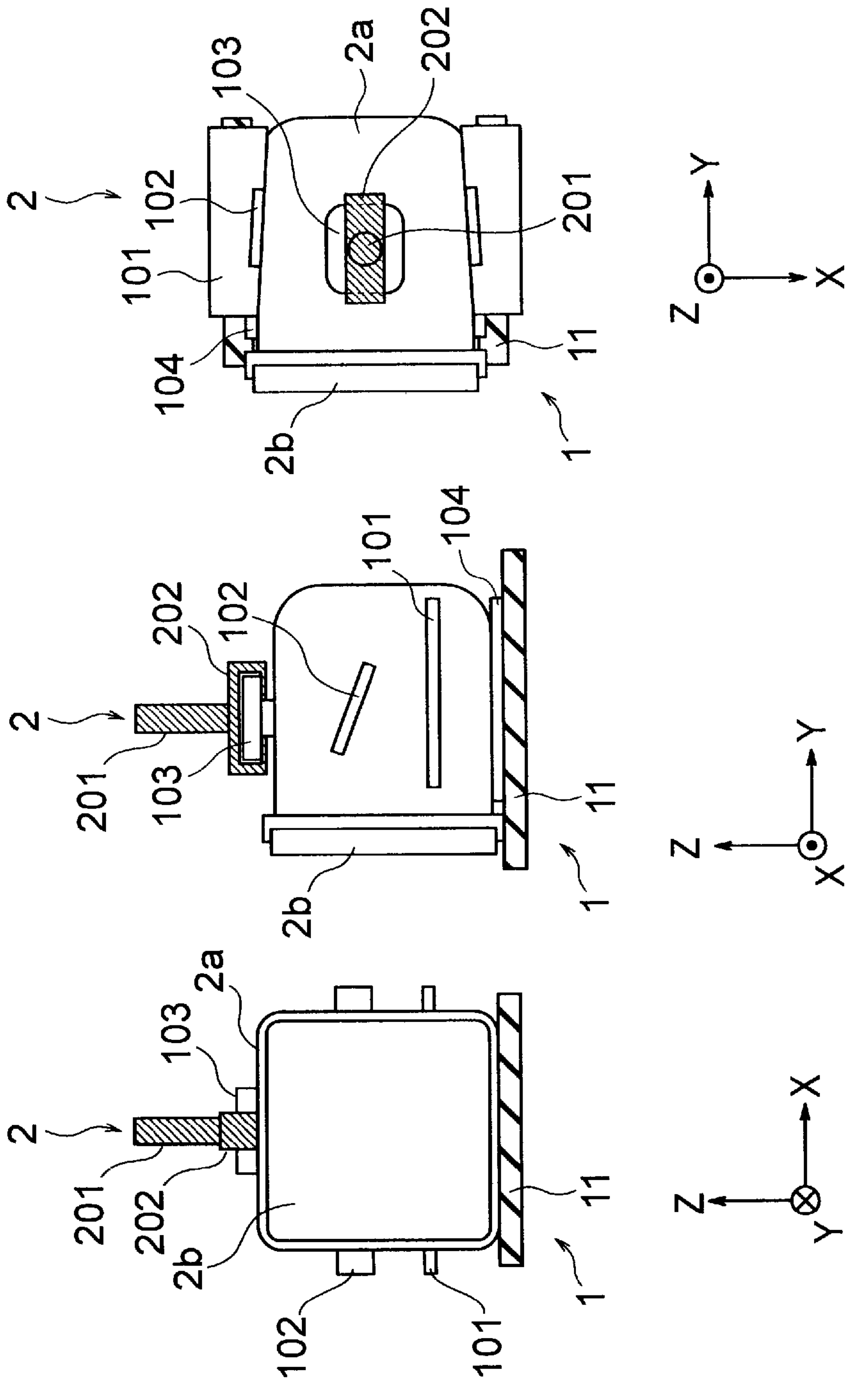
FIGS. 24A to 24C are trihedral views illustrating a structure of a FOUP according to a sixth embodiment.

FIGS. 24A to 24C are trihedral views illustrating the structure of the FOUP 2 according to a sixth embodiment.

FIGS. 24A, 24B, and 24C illustrate one side surface, another side surface, and an upper surface of the same FOUP 2, respectively. The FOUP 2 according to the present embodiment becomes a washing target according to any one of the first to fifth embodiments.

As described above, the FOUP 2 according to the present embodiment includes the FOUP main body 2*a* and the FOUP door 2*b*. In addition, as illustrated in FIGS. 24A to 24C, the FOUP main body 2*a* according to the present embodiment includes two handles 101, two handles 102, a grip portion 103, and an underlay portion 104. FIGS. 24A to 24C further illustrate a shaft 201 extending from OHT and a grip portion 202 provided at the tip of the shaft 201.

The handles 101 raise the FOUP 2 by the conveyance device. The handles 102 are provided for a person to hold the FOUP 2 by hands. The grip portion 103 is a part to be gripped by the grip portion 202. The shaft 201 can move the FOUP 2 in the vertical direction or the horizontal direction by gripping the grip portion 103 by the grip portion 202. The underlay portion 104 forms the base of the FOUP main body 2*a*.

The FOUP 2 illustrated in FIGS. 24A to 24C is placed on the load port 11. When the FOUP 2 is placed on the load port 11, the FOUP 2 is placed so that the grip portion 103 faces upward. The reason is that the grip portion 103 needs to be gripped by the grip portion 202.

Figures 25A, 25B, 25C:
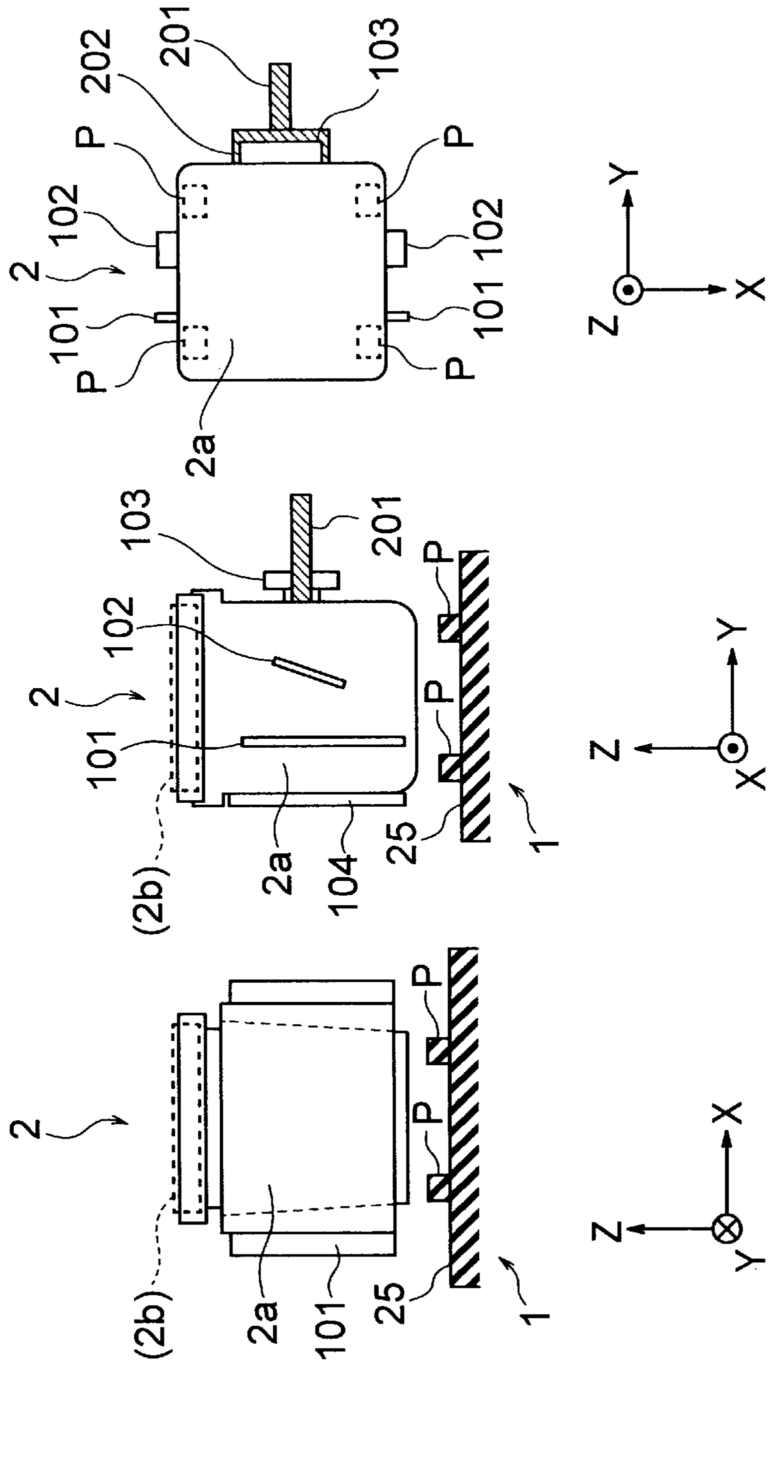
FIGS. 25A to 25C are other trihedral views illustrating the structure of the FOUP according to the sixth embodiment.

FIGS. 25A to 25C are other trihedral views illustrating the structure of the FOUP 2 according to the sixth embodiment.

FIGS. 25A to 25C illustrate one side surface, another side surface, and the upper surface of the same FOUP 2, respectively. The FOUP 2 illustrated in FIGS. 25A to 25C is placed on a plurality of pedestals P of the washing unit 25. Specifically, FIG. 25A (a) to 25C illustrate the FOUP main body 2*a* of the state in which the FOUP door 2*b* is detached.

Like the FOUP main body 2*a* illustrated in FIGS. 4 and 6, the FOUP main body 2*a* illustrated in FIGS. 25A to 25C is placed so that the bottom portion of the FOUP main body 2*a* faces downward, and the opening of the FOUP main body 2*a* faces upward. Accordingly, it is possible to accumulate hot water in the FOUP main body 2*a* and wash the FOUP main body 2*a* (gas removal).

The washing device 1 according to the present embodiment takes the FOUP 2 placed on the load port 11 into the chamber 12 by the conveyance robot 21 (FIG. 1). The conveyance robot 21 rotates the FOUP 2 by 90 degrees about the horizontal axis and changes the direction of the FOUP 2 from the direction illustrated in FIGS. 24A to 24C to the direction illustrated in FIGS. 25A to 25C. At this point, the conveyance robot 21 changes the direction of the FOUP 2 by gripping the grip portion 103 and operating the FOUP 2. In addition, the operation of changing the direction of the FOUP 2 may be performed before the FOUP door 2*b* is detached from the FOUP main body 2*a* and may be performed after the FOUP door 2*b* is detached from the FOUP main body 2*a*.

It is preferable that the pedestal P according to the present embodiment has a shape in which the pedestal P hardly interferes with the washing when the outer surface of the FOUP main body 2*a* is washed. For example, the shape of the pedestal P in plan view is close to a point, and when the FOUP main body 2*a* is supported by the pedestals P in point contact, the contact areas between the pedestals P and the FOUP main body 2*a* are small, so the pedestals P hardly interfere with the washing. In addition, the FOUP main body 2*a* may be supported by the pedestals P in line contact by causing the shape of the pedestal P in plan view to be close to a line. The pedestals P function as a supporter to support the FOUP 2.

Figures 26A, 26B, 26C:
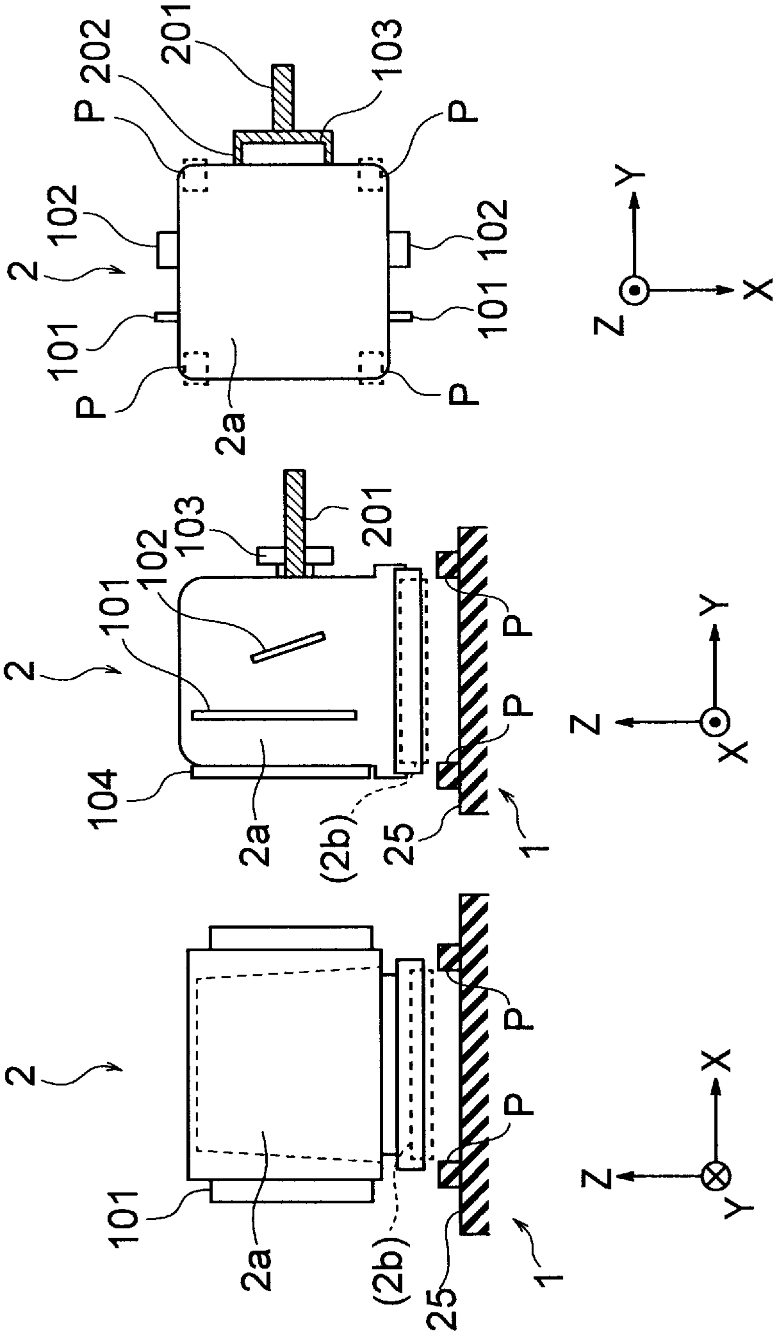
FIGS. 26A to 26C are other trihedral views illustrating the structure of the FOUP according to the sixth embodiment.

FIGS. 26A to 26C are other trihedral views illustrating the structure of the FOUP 2 according to the sixth embodiment.

FIGS. 26A to 26C illustrate one side surface, another side surface, and the upper surface of the same FOUP 2, respectively. The FOUP 2 illustrated in FIGS. 26A to 26C is also placed on a plurality of pedestals P of the washing unit 25.

Specifically, FIGS. 26A to 26C also illustrate the FOUP main body 2*a* of the state in which the FOUP door 2*b* is detached.

Like the FOUP main body 2*a* illustrated in FIG. 10, the FOUP main body 2*a* illustrated in FIGS. 26A to 26C is placed so that the bottom portion of the FOUP main body 2*a* faces upward, and the opening of the FOUP main body 2*a* faces downward. Accordingly, it is possible to remove dusts attached to the inner surface of the FOUP main body 2*a* by washing (dust removal). In addition, the state illustrated in FIGS. 26A to 26C may be adopted also in a case of the washing described according to the second to fourth embodiments, that is, the washing that also performs gas removal and dust removal.

In addition, the operation of rotating the FOUP 2 in the direction illustrated in FIGS. 26A to 26C is performed by the conveyance robot 21 as described above. In addition, the shape or the number of the pedestals P illustrated in FIGS. 26A to 26C may be the same as the shape or the number of the pedestals P illustrated in FIGS. 25A to 25C and may be different from the shape or the number of the pedestals P illustrated in FIGS. 25A to 25C.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A washing device comprising:

a supporter configured to support a container, the container being capable of storing a substrate therein, the container having an inner surface facing the substrate when stored and an outer surface opposite to the inner surface;

a temperature adjuster that is configured to at least one of: heat a first fluid for washing the container; or cool a second fluid for washing the container, to prepare the first fluid having a first temperature and the second fluid having a second temperature lower than the first temperature;

a first water channel including a portion extending into the container and configured to supply the first fluid having the first temperature to the inner surface of the container during a first period of time, thereby heating and washing the inner surface of the container during the first period of time;

a second water channel configured to supply the second fluid having the second temperature to the outer surface of the container during the first period of time, thereby cooling and washing the outer surface of the container during the first period of time:

a first nozzle connected to one end of the first water channel;

a heater connected to the other end of the first water channel;

a second nozzle connected to one end of the second water channel; and a cooler connected to the other end of the second water channel;

wherein the first water channel and the second water channel are disconnected from each other, the supporter supports the container in a state where an opening thereof faces towards a first direction in a vertical axis, an opening of the first nozzle opens towards a first direction in a lateral axis, and an opening of the second nozzle opens towards a second direction in the lateral axis.

2. The washing device according to claim 1, wherein the first temperature is equal to or higher than about 70° C.

3. The washing device according to claim 1, wherein the first fluid before being heated by the temperature adjuster is liquid-like water, the first fluid after being heated by the temperature adjuster is liquid-like or vapor-like water, and the washer supplies the liquid-like or vapor-like water to the first surface to heat and wash the container.

4. The washing device according to claim 1, wherein the second temperature is equal to or lower than about 10° C.

5. The washing device according to claim 1, wherein the temperature adjuster is further configured to supply a gas for cooling the container, and the temperature adjuster is further configured to supply the gas to the second surface to cool the container.

6. The washing device according to claim 1, wherein the temperature adjuster is further configured to supply a liquid other than water for cooling the container, and the temperature adjuster is further configured to supply the liquid to the second surface to cool the container.

7. The washing device according to claim 1, wherein a temperature difference between the first temperature and the second temperature is equal to or higher than about 70° C.

8. The washing device according to claim 1, wherein the washer is further configured to heat and cool the container so that the temperature difference between the first surface and the second surface is equal to or higher than about 70° C.

9. The washing device according to claim 1, wherein the washer is further configured to accumulate the first fluid in the container or shower the first fluid into the container to heat and wash the container.

10. The washing device according to claim 1, further comprising:

a controller configured to control the washer to alternately heat and cool the container by supplying the first fluid to the first surface of the container and by supplying the second fluid to the second surface of the container.

11. The washing device according to claim 1, wherein the washer includes a first washing unit that washes a first part of the container and a second washing unit that washes a second part of the container.

12. The washing device according to claim 11, wherein the first part is a main body of the container, and the second part is a lid of the container.

13. The washing device according to claim 11, wherein the first washing unit washes the first part in a state in which a bottom portion of the first part faces downward.

14. The washing device according to claim 11, wherein the first washing unit washes the first part in a state in which a bottom portion of the first part faces upward.

15. The washing device according to claim 1, further comprising:

a plurality of the first water channels, and each of the first water channels supplies the first fluid having the first temperature to the inner surface of the container during the first period of time, and a plurality of the second water channels, and each of the second water channels supplies the second fluid having the second temperature to the outer surface of the container during the first period of time.

16. The washing device according to claim 1, wherein during the first period of time, the first water channel supplies the first fluid having the first temperature to the inner surface of the container and the second water channel supplies the second fluid having the second temperature to the outer surface of the container so as to suppress a temperature of the container to be lower 130 Celsius degrees.

* * * * *